(12) United States Patent
Miyazawa et al.

(10) Patent No.: US 7,253,552 B2
(45) Date of Patent: Aug. 7, 2007

(54) PIEZOELECTRIC ACTUATOR, TIMEPIECE, AND PORTABLE DEVICE

(75) Inventors: Osamu Miyazawa, Nagano-ken (JP); Yasuharu Hashimoto, Nagano-ken (JP); Tsukasa Funasaka, Nagano-ken (JP); Makoto Furuhata, Nagan-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/425,330

(22) Filed: Jun. 20, 2006

(65) Prior Publication Data

US 2006/0226737 A1 Oct. 12, 2006

Related U.S. Application Data

(62) Division of application No. 10/771,786, filed on Feb. 4, 2004, now Pat. No. 7,078,847, which is a division of application No. 09/622,685, filed as application No. PCT/JP99/04877 on Sep. 8, 1999, now Pat. No. 6,885,615.

(30) Foreign Application Priority Data

| Dec. 21, 1998 | (JP) | ................................. 10-363543 |
| Dec. 21, 1998 | (JP) | ................................. 10-363546 |
| Dec. 21, 1998 | (JP) | ................................. 10-363550 |
| Mar. 15, 1999 | (JP) | ................................. 11-069158 |
| Sep. 3, 1999 | (JP) | ................................. 11-250225 |

(51) Int. Cl.
*H01L 41/08* (2006.01)
(52) U.S. Cl. .............. 310/323.02; 310/323.16
(58) Field of Classification Search .......... 310/323.01, 310/323.02, 323.12, 323.16, 316.01, 316.02, 310/328
See application file for complete search history.

(56) References Cited

U.S. PATENT DOCUMENTS

| 4,232,510 A | | 11/1980 | Tamaru et al. |
| 5,162,692 A | * | 11/1992 | Fujimura ............... 310/323.15 |
| 5,319,278 A | | 6/1994 | Myohga et al. |
| 5,345,137 A | | 9/1994 | Funakubo et al. |
| 5,357,489 A | | 10/1994 | Luthier |
| 5,747,916 A | | 5/1998 | Sugimoto et al. |
| 5,852,336 A | | 12/1998 | Takagi |

(Continued)

FOREIGN PATENT DOCUMENTS

DE 1241371 5/1967

(Continued)

OTHER PUBLICATIONS

Anger H H: "Piezokeramische Vibromotoren", FEINGERAETETECHNIK, 1983, East Germany, vol. 32, No. 10, pp. 470-473, XP001181520, ISSN: 0014-9683.

(Continued)

*Primary Examiner*—Mark Budd
(74) *Attorney, Agent, or Firm*—Rosalio Haro

(57) ABSTRACT

A rectangular vibrating plate 10 in which a piezoelectric element and a reinforcing plate are stacked is supported on a main plate by a support member 11, and is urged toward the rotor 100 by an elastic force of the support member 11. This brings a projection 36 provided on the vibrating plate 10 into abutment with an outer peripheral surface of the rotor 100. In this construction, when the vibrating plate 10 vibrates in the horizontal direction in the figure by an applied voltage from a driving circuit (not shown), the rotor 100 is rotated in a clockwise direction in accordance with the displacement of the projection 36 due to the vibration.

20 Claims, 30 Drawing Sheets

U.S. PATENT DOCUMENTS

| | | | |
|---|---|---|---|
| 5,877,579 A * | 3/1999 | Zumeris | 310/323.01 |
| 6,064,140 A | 5/2000 | Zumeris | |
| 6,081,063 A | 6/2000 | Kasuga et al. | |
| 6,121,717 A | 9/2000 | Diefenbach et al. | |
| 6,211,603 B1 | 4/2001 | Iino et al. | |
| 6,218,769 B1 * | 4/2001 | Iino et al. | 310/328 |
| 6,252,332 B1 * | 6/2001 | Takagi et al. | 310/323.02 |
| 6,266,296 B1 | 7/2001 | Miyazawa | |
| 6,396,194 B1 | 5/2002 | Iino et al. | |
| 6,512,659 B1 | 1/2003 | Hawwa et al. | |
| 6,831,393 B2 * | 12/2004 | Miyazawa | 310/323.14 |
| 6,885,615 B1 * | 4/2005 | Miyazawa et al. | 368/255 |
| 6,909,223 B2 * | 6/2005 | Miyazawa | 310/328 |
| 6,979,934 B1 * | 12/2005 | Wischnewskiy | 310/323.01 |
| 7,075,211 B1 * | 7/2006 | Ganor et al. | 310/317 |
| 7,078,847 B2 * | 7/2006 | Miyazawa et al. | 310/323.02 |
| 7,116,038 B2 * | 10/2006 | Miyazawa et al. | 310/323.02 |
| 7,119,476 B2 * | 10/2006 | Nagahama | 310/317 |

FOREIGN PATENT DOCUMENTS

| | | |
|---|---|---|
| DE | 1488698 | 6/1969 |
| DE | 2530045 | 2/1976 |
| DE | 3309239 | 9/1984 |
| DE | 3920726 | 1/1990 |
| DE | 3833342 | 4/1990 |
| EP | 0731514 | 9/1996 |
| JP | 5434010 | 3/1979 |
| JP | 55125052 | 9/1980 |
| JP | 5937672 | 9/1984 |
| JP | 6016180 | 1/1985 |
| JP | 60178677 | 9/1985 |
| JP | 60150757 | 10/1985 |
| JP | 62239876 | 10/1987 |
| JP | 63118591 | 8/1988 |
| JP | 63294281 | 11/1988 |
| JP | 226282 | 1/1990 |
| JP | 284078 | 3/1990 |
| JP | 31692 | 1/1991 |
| JP | 311983 | 1/1991 |
| JP | 3145977 | 6/1991 |
| JP | 4129942 | 4/1992 |
| JP | 4145879 | 5/1992 |
| JP | 52594 | 1/1993 |
| JP | 53688 | 1/1993 |
| JP | 5122955 | 5/1993 |
| JP | 5308786 | 11/1993 |
| JP | 6319279 | 11/1994 |
| JP | 8275558 | 10/1996 |
| JP | 10225151 | 8/1998 |
| JP | 10327589 | 12/1998 |
| JP | 1152075 | 2/1999 |
| JP | 2000116158 | 4/2000 |

OTHER PUBLICATIONS

K. Nishibori, et al., "PWM Driving Characteristics of Robot Hand with Fingers Using Vibration-Type Ultrasonic Motors" Proceedings of the IECON '97: 23rd International Conference on Industrial Electronics, Control, And Instrumentation, New Orleans, Nov. 9-14, 1997, Proceedings of IEEE IECON: International Conference on Industrial Electronics, Control, and Instrume, vol. 3, Nov. 9, 1997, pp. 1355-1360, XP000790715, ISBN: 0-7803-3933-0.

* cited by examiner

Fig. 4
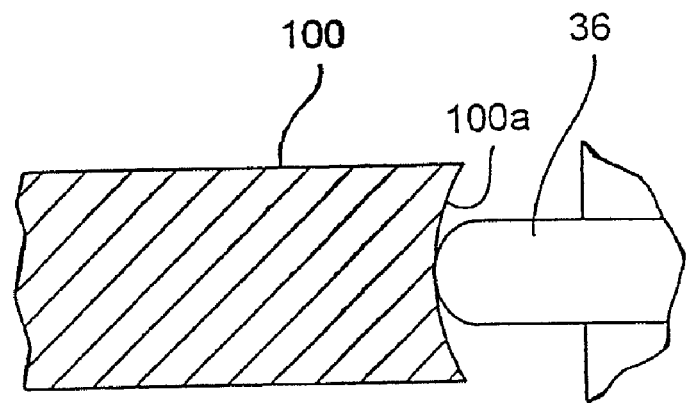
(a)
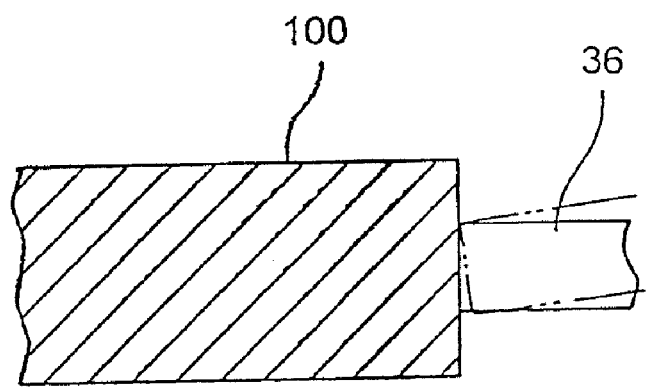
(b)
Fig. 5
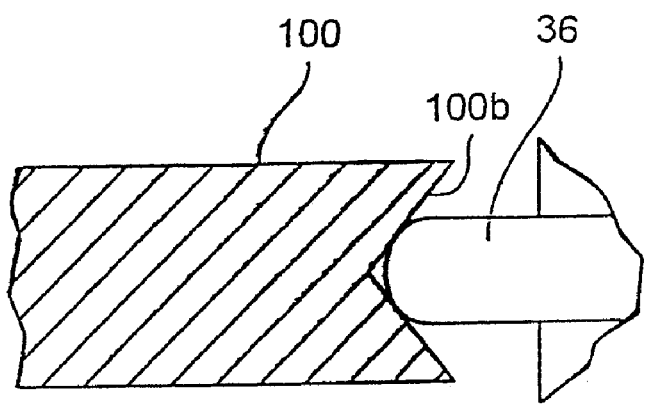

284.3kHz
288.6 kHz

Fig. 49
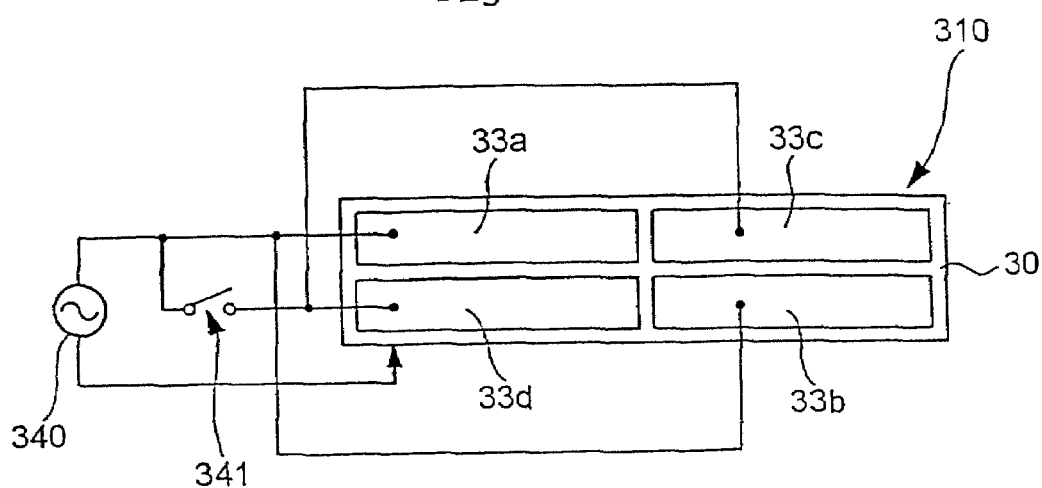
Fig. 50
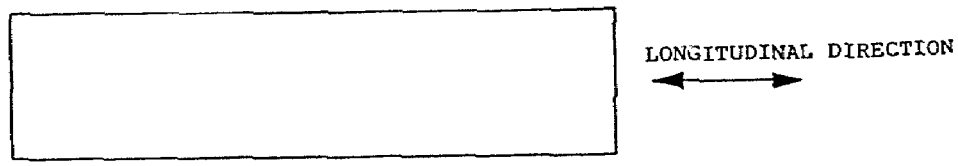
(a) LONGITUDINAL VIBRATION
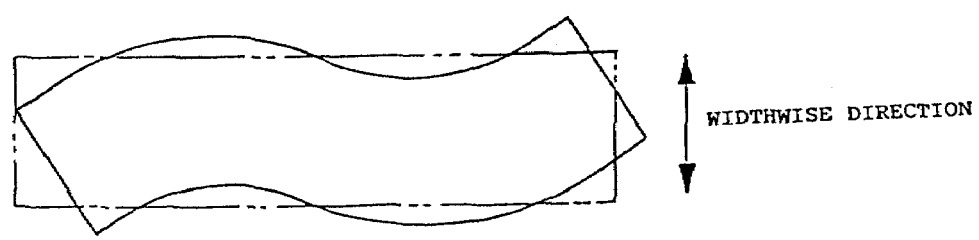
(b) BENDING VIBRATION Fig. 58
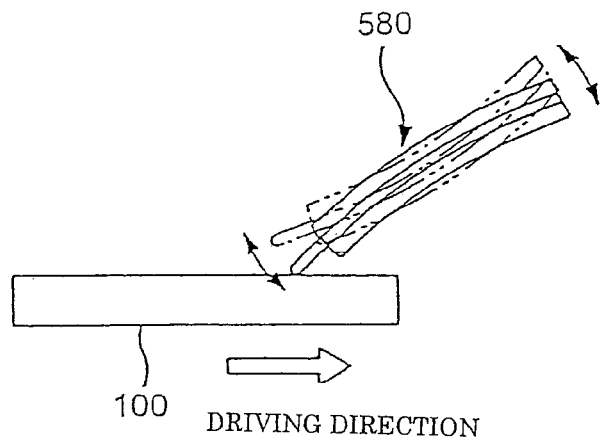
Fig. 59
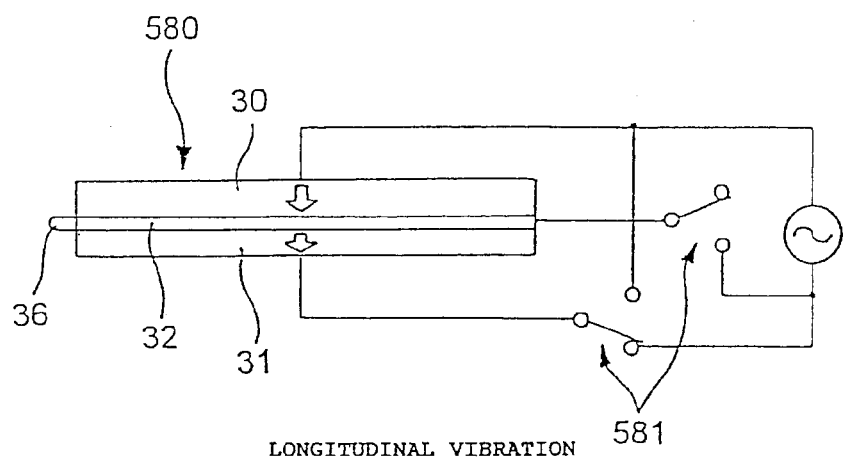
LONGITUDINAL VIBRATION
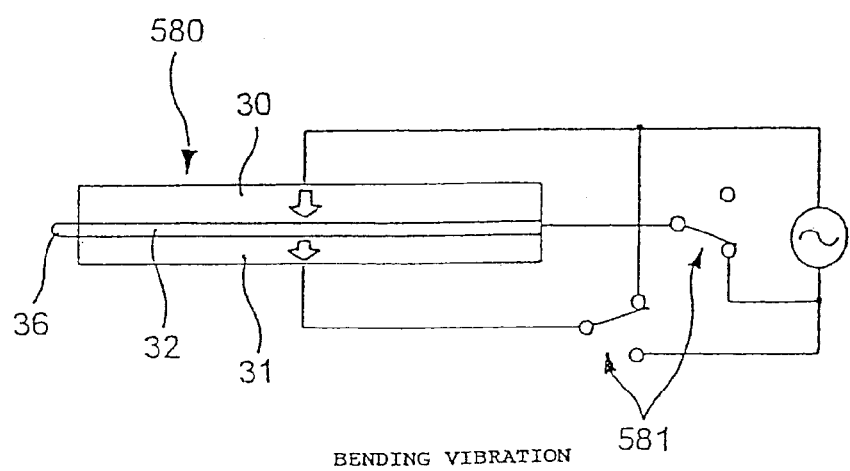
BENDING VIBRATION

PIEZOELECTRIC ACTUATOR, TIMEPIECE, AND PORTABLE DEVICE

CONTINUING APPLICATION DATA

This application is a divisional of U.S. patent application Ser. No. 10/771,786 filed Feb. 4, 2004, now U.S. Pat. No. 7,078,847 which is a divisional of U.S. patent application Ser. No. 09/622,685 filed Aug. 18, 2000, issued as U.S. Pat. No. 6,885,615, which is a 371 of International Application No. PCT/JP99/04877 filed Sep. 8, 1999, which are hereby incorporated by reference in its/their entirety.

BACKGROUND OF THE INVENTION

1. Field of the Invention

The present invention relates to a piezoelectric actuator, and to a timepiece and a portable device including the piezoelectric actuator.

2. Description of the Related Art

Since piezoelectric elements have excellent responsiveness and conversion efficiency from electrical energy to mechanical energy, various types of piezoelectric actuators utilizing the piezoelectric effect of piezoelectric elements have been developed in recent years. The piezoelectric actuators have been applied to the fields of piezoelectric buzzers, ink-jet heads of printers, and ultrasonic motors.

FIG. 61 is a plan view schematically showing an ultrasonic motor using a conventional piezoelectric actuator. As shown in the figure, the ultrasonic motor of this type is called a poking type in which a rotor surface is slightly inclined and brought into contact with a tip of a vibrating piece connected to a piezoelectric element. In such a construction, when the piezoelectric element is expanded and contracted by an alternating voltage from an oscillator, and the vibrating piece reciprocates in a longitudinal direction, a force component is generated in a circumferential direction of the rotor and the rotor is rotated.

In addition, a technique has been known in which two ultrasonic vibrators (piezoelectric elements) are included, the ultrasonic vibrators vibrate with their own electrical resonance frequencies, and a vibrating piece is displaced by the vibration (Japanese Unexamined Application Publication No. 10-25151).

However, while the displacement of the piezoelectric element depends on the applied voltage, it is very small, usually about sub-micron, and this also applies to a case where the piezoelectric element vibrates with the above-described resonance frequency. For this reason, the displacement is amplified by a certain amplification mechanism, and is transmitted to the rotor. When the amplification mechanism is used, however, energy is consumed to operate the amplification mechanism, efficiency is lowered, and the size of an apparatus increases. In addition, when the amplification mechanism is used, it may be difficult to stably transmit a driving force to the rotor.

In addition, since a small portable device, such as a wristwatch, is driven by a battery, it is necessary to lower the consumption of electrical energy and the drive voltage. Therefore, when a piezoelectric actuator is incorporated into such a portable device, it is particularly required that the energy efficiency be high and the drive voltage be low.

Incidentally, in a calendar display mechanism for displaying the date, the day, and so forth in a timepiece or the like, it is common for the rotational driving force from an electromagnetic stepping motor to be intermittently transmitted to a date indicator or the like via a watch-hand-driving wheel train so as to advance the date indicator or the like. On the other hand, since the wristwatch is carried by being strapped on a wrist, a reduction in thickness for convenience of carrying has long been demanded. In order to pursue the reduction in thickness, it is also necessary to reduce the thickness of the calendar display mechanism. However, since the stepping motor is constructed by incorporating parts, such as a coil and a rotor, thereinto in an out-of-plane direction, the reduction in thickness of the calendar display mechanism is limited. For this reason, there is a problem in that the conventional calendar mechanism using the stepping motor is not structurally suited for reducing the thickness.

In particular, in order to share a mechanical system (a so-called movement) between a timepiece with a calendar display mechanism and a timepiece without such a display mechanism, it is necessary to construct the calendar display mechanism on the side of a dial. However, it is difficult for an electromagnetic stepping motor to achieve a reduction in thickness to such an extent that the calendar mechanism can be constructed on the side of the dial. Therefore, it is necessary for a conventional timepiece to be manufactured by separately designing watch-hand-driving mechanical systems according to whether there is a display mechanism, and this becomes a problem when improving the productivity thereof.

The present invention is made in consideration of the foregoing circumstances, and an object is to provide a piezoelectric actuator that facilitates a reduction in size by simplifying conductive construction, and to provide a timepiece and a portable device including the same. In addition, it is an object to provide a piezoelectric actuator that is able to efficiently transmit vibrations of a piezoelectric element, that is suited for a reduction in size and thickness, and that is able to stably transmit a driving force, and to provide a timepiece and a portable device including the same.

SUMMARY OF THE INVENTION

According to the present invention, there is provided a piezoelectric actuator comprising: a base frame; a vibrating plate in which a longitudinal plate-like piezoelectric element and a reinforcing portion are stacked; and a support member, which is an elastic member, having a fixing portion fixed to the base frame and a mounting portion mounted on the vibrating plate, and which provides an elastic force to the vibrating plate so that a longitudinal end of the vibrating plate abuts against an object to be driven; wherein, when the piezoelectric element vibrates in the longitudinal direction of the vibrating plate, the vibrating plate is vibrated by the vibration, and the object to be driven is driven in one direction in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a support member having a fixing portion fixed to the base frame and a mounting portion mounted on the vibrating plate, and supporting the vibrating plate on the base frame; and an elastic member for providing an elastic force to the vibrating plate so that the longitudinal end of the vibrating plate abuts against an object to be driven; wherein, when the piezoelectric element vibrates in the longitudinal direction of the vibrating plate, the vibrating plate is vibrated by the vibration, and the object to be driven is driven in one direction in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a rotor having front and back surfaces, and rotationally supported on the base frame in the direction perpendicular to the front and back surfaces as the direction of a rotation axis; and a support member, which is an elastic member, having a fixing portion fixed to the base frame and a mounting portion mounted on the vibrating plate, and which provides an elastic force to the vibrating plate so that a longitudinal end of the vibrating plate abuts against the front surface or the back surface of the rotor; wherein, when the piezoelectric element vibrates in the longitudinal direction of the vibrating plate, the vibrating plate is vibrated by the vibration, and the rotor is driven in one direction in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a rotor having front and back surfaces, and rotationally supported on the base frame in the direction perpendicular to the front and back surfaces as the direction of a rotation axis; a support member having a fixing portion fixed to the base frame and a mounting portion mounted on the vibrating plate, and supporting the vibrating plate on the base frame; and an elastic member for providing an elastic force to the vibrating plate so that the longitudinal end of the vibrating plate abuts against the front surface or the back surface of the rotor; wherein, when the piezoelectric element vibrates in the longitudinal direction of the vibrating plate, the vibrating plate is vibrated by the vibration, and the rotor is driven in one direction in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a rotor having an outer peripheral surface, and rotationally supported on the base frame; and a support member, which is an elastic member, having a fixing portion fixed to the base frame and a mounting portion mounted on the vibrating plate, and which provides an elastic force to the vibrating plate so that a longitudinal end of the vibrating plate abuts against the outer peripheral surface of the rotor; wherein, when the piezoelectric element vibrates in the longitudinal direction of the vibrating plate, the vibrating plate is vibrated by the vibration, and the rotor is driven in one direction in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a rotor having an outer peripheral surface, and rotationally supported on the base frame; a support member having a fixing portion fixed to the base frame and a mounting portion mounted on the vibrating plate, and supporting the vibrating plate on the base frame; and an elastic member for providing an elastic force to the vibrating plate so that the longitudinal end of the vibrating plate abuts against the outer peripheral surface of the rotor; wherein, when the piezoelectric element vibrates in the longitudinal direction of the vibrating plate, the vibrating plate is vibrated by the vibration, and the rotor is driven in one direction in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a rotor having an outer peripheral surface, rotationally supported on the base frame, a rotating shaft thereof being movable; a support member having a fixing portion fixed to the base frame and a mounting portion mounted on the vibrating plate, and supporting the vibrating plate on the base frame; and an elastic member for providing an elastic force to the rotor so that the outer peripheral surface of the rotor abuts against the longitudinal end of the vibrating plate; wherein, when the piezoelectric element vibrates in the longitudinal direction of the vibrating plate, the vibrating plate is vibrated by the vibration, and the rotor is driven in one direction in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a rotor having an outer peripheral surface, and rotationally supported on the base frame; and a support member having a fixing portion fixed to the base frame and a mounting portion mounted on the vibrating plate, and supporting the vibrating plate on the base frame; wherein the rotor is formed of an elastic body arranged on a position where the outer peripheral surface thereof abuts against the longitudinal end of the vibrating plate, and presses the outer peripheral surface against the end of the vibrating plate by the elastic force thereof; and wherein, when the piezoelectric element vibrates in the longitudinal direction of the vibrating plate, the vibrating plate is vibrated by the vibration, and the rotor is driven in one direction in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a selection means for selecting either a longitudinal vibration for vibrating the vibrating plate in the longitudinal direction within a plane to which the vibrating plate belongs, or a bending vibration for vibrating the vibrating plate in the widthwise direction perpendicular to the longitudinal direction within the plane; and a support member, which is an elastic member, having a fixing portion fixed to the base frame and a mounting portion mounted on the vibrating plate, and which provides an elastic force to the vibrating plate so that a longitudinal end of the vibrating plate abuts against an object to be driven; wherein, when the longitudinal vibration is selected by the selection means, the vibrating plate causes the longitudinal vibration, whereby the object to be driven is driven in one direction in accordance with the displacement of the vibrating plate due to the vibration, and wherein, when the bending vibration is selected by the selection means, the vibrating plate causes the bending vibration, whereby the object to be driven is driven in the direction opposite to the direction during the longitudinal vibration in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a selection means for selecting either a longitudinal vibration for vibrating the vibrating plate in the longitudinal direction within a plane to which the vibrating plate belongs, or a bending vibration for vibrating the vibrating plate in the widthwise direction perpendicular to the longitudinal direction within the plane; a support member having a fixing portion fixed to the base frame and mounting portion mounted on the vibrating plate, and supporting the vibrating plate on the base frame; and an elastic member for providing an elastic force to the vibrating plate so that a longitudinal end of the vibrating plate abuts against an object to be driven; wherein, when the longitudinal vibration is selected by the selection means, the vibrating plate causes the longitudinal vibration, whereby the object to be driven is driven in one direction in accordance with the displacement of the vibrating plate due to the vibration, and wherein, when the bending vibration is selected by the selection means, the vibrating plate causes the bending vibration, whereby the object to be driven is driven in the direction opposite to the direction during the longitudinal vibration in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a rotor having front and back surfaces, and rotationally supported on the base frame in the direction perpendicular to the front and back surfaces as the direction of a rotation axis; a selection means for selecting either a longitudinal vibration for vibrating the vibrating plate in the longitudinal direction within a plane to which the vibrating plate belongs, or a bending vibration for vibrating the vibrating plate in the out-of-plane direction; and a support member, which is an elastic member, having a fixing portion fixed to the base frame and a mounting portion mounted on the vibrating plate, and which provides an elastic force to the vibrating plate so that a longitudinal end of the vibrating plate abuts against the front surface or the back surface of the rotor; wherein, when the longitudinal vibration is selected by the selection means, the vibrating plate causes the longitudinal vibration, whereby the rotor is rotationally driven in one direction in accordance with the displacement of the vibrating plate due to the vibration, and wherein, when the bending vibration is selected by the selection means, the vibrating plate causes the bending vibration, whereby the rotor is rotationally driven in the direction opposite to the direction during the longitudinal vibration in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a rotor having front and back surfaces, and rotationally supported on the base frame in the direction perpendicular to the front and back surfaces as the direction of a rotation axis; a selection means for selecting either a longitudinal vibration for vibrating the vibrating plate in the longitudinal direction within a plane to which the vibrating plate belongs, or a bending vibration for vibrating the vibrating plate in the out-of-plane direction; a support member having a fixing portion fixed to the base frame and a mounting portion mounted on the vibrating plate, and supporting the vibrating plate on the base frame; and an elastic member for providing an elastic force to the vibrating plate so that a longitudinal end of the vibrating plate abuts against the front surface or the back surface of the rotor; wherein, when the longitudinal vibration is selected by the selection means, the vibrating plate causes the longitudinal vibration, whereby the rotor is rotationally driven in one direction in accordance with the displacement of the vibrating plate due to the vibration, and wherein, when the bending vibration is selected by the selection means, the vibrating plate causes the bending vibration, whereby the rotor is rotationally driven in the direction opposite to the direction during the longitudinal vibration in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a rotor having an outer peripheral surface, and rotationally supported on the base frame; a selection means for selecting either a longitudinal vibration for vibrating the vibrating plate in the longitudinal direction within a plane to which the vibrating plate belongs, or a bending vibration for vibrating the vibrating plate in the widthwise direction perpendicular to the longitudinal direction within the plane; and a support member, which is an elastic member having a fixing portion fixed to the base frame and a mounting portion mounted on the vibrating plate, and which provides an elastic force to the vibrating plate so that a longitudinal end of the vibrating plate abuts against the outer peripheral surface of the rotor; wherein, when the longitudinal vibration is selected by the selection means, the vibrating plate causes the longitudinal vibration, whereby the rotor is rotationally driven in one direction in accordance with the displacement of the vibrating plate due to the vibration, and wherein, when the bending vibration is selected by the selection means, the vibrating plate causes the bending vibration, whereby the rotor is rotationally driven in the direction opposite to the direction during the longitudinal vibration in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a rotor having an outer peripheral surface, and rotationally supported on the base frame; a selection means for selecting either a longitudinal vibration for vibrating the vibrating plate in the longitudinal direction within a plane to which the vibrating plate belongs, or a bending vibration for vibrating the vibrating plate in the widthwise direction perpendicular to the longitudinal direction within the plane; a support member having a fixing portion fixed to the base frame and a mounting portion mounted on the vibrating plate, and supporting the vibrating plate on the base frame; and an elastic member for providing an elastic force to the vibrating plate so that a longitudinal end of the vibrating plate abuts against the outer peripheral surface of the rotor; wherein, when the longitudinal vibration is selected by the selection means, the vibrating plate causes the longitudinal vibration, whereby the rotor is rotationally driven in one direction in accordance with the displacement of the vibrating plate due to the vibration, and wherein, when the bending vibration is selected by the selection means, the vibrating plate causes the bending vibration, whereby the rotor is rotationally driven in the direction opposite to the direction during the longitudinal vibration in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a rotor having an outer peripheral surface, rotationally supported on the base frame, a rotating shaft thereof being movable; a selection means for selecting either a longitudinal vibration for vibrating the vibrating plate in the longitudinal direction within a plane to which the vibrating plate belongs, or a bending vibration for vibrating the vibrating plate in the widthwise direction perpendicular to the longitudinal direction within the plane; a support member having a fixing portion fixed to the base frame and a mounting portion mounted on the vibrating plate, and supporting the vibrating plate on the base frame; and an elastic member for providing an elastic force to the rotor so that the outer peripheral surface of the rotor abuts against a longitudinal end of the vibrating plate; wherein, when the longitudinal vibration is selected by the selection means, the vibrating plate causes the longitudinal vibration, whereby the rotor is rotationally driven in one direction in accordance with the displacement of the vibrating plate due to the vibration, and wherein, when the bending vibration is selected by the selection means, the vibrating plate causes the bending vibration, whereby the rotor is rotationally driven in the direction opposite to the direction during the longitudinal vibration in accordance with the displacement of the vibrating plate due to the vibration.

In another form of the present invention, there is provided a piezoelectric actuator comprising: a base frame; a vibrating plate in which a longitudinal plate-like piezoelectric element and a reinforcing portion are stacked; a rotor having an outer peripheral surface, and rotationally supported on the base frame; a selection means for selecting either a longitudinal vibration for vibrating the vibrating plate in the longitudinal direction within a plane to which the vibrating plate belongs, or a bending vibration for vibrating the vibrating plate in the widthwise direction perpendicular to the longitudinal direction within the plane; and a support member having a fixing portion fixed to the base frame and a mounting portion mounted on the vibrating plate, and supporting the vibrating plate on the base frame; wherein the rotor is formed of an elastic body arranged on the position where the outer peripheral surface thereof abuts against a longitudinal end of the vibrating plate, and presses the outer peripheral surface against the end of the vibrating plate by the elastic force thereof; wherein, when the longitudinal vibration is selected by the selection means, the vibrating plate causes the longitudinal vibration, whereby the rotor is rotationally driven in one direction in accordance with the displacement of the vibrating plate due to the vibration, and wherein, when the bending vibration is selected by the selection means, the vibrating plate causes the bending vibration, whereby the rotor is rotationally driven in the direction opposite to the direction during the longitudinal vibration in accordance with the displacement of the vibrating plate due to the vibration.

From another standpoint, according to the present invention, there is provided a piezoelectric actuator having a piezoelectric element, and driving an object to be driven by the vibration of the piezoelectric element; the piezoelectric actuator comprising reinforcing portions stacked on the upper and lower sides of the piezoelectric element; wherein power is supplied to the piezoelectric element via the reinforcing portions.

In another form of the present invention, there is provided a piezoelectric actuator having a piezoelectric element, and driving an object to be driven by the vibration of the piezoelectric element; the piezoelectric actuator comprising: a base frame; and a support member formed of a conductive material, and supporting the piezoelectric element on the base frame; wherein power is supplied to the piezoelectric element via the support member.

In another form of the present invention, there is provided a piezoelectric actuator having a piezoelectric element, and driving an object to be driven by the vibration of the piezoelectric element; the piezoelectric actuator comprising an elastic conductive material contacting the upper and lower surfaces of the vibrating plate to clamp the vibrating plate; wherein power is supplied to the piezoelectric element via the elastic conductive material.

In another form of the present invention, there is provided a piezoelectric actuator having a piezoelectric element, and driving an object to be driven by the vibration of the piezoelectric element; the piezoelectric actuator comprising a wire wound around the vibrating plate while being in contact therewith; wherein power is supplied to the piezoelectric element via the wire.

In addition, according to the present invention, there is provided a timepiece comprising: a piezoelectric actuator in any one of the above forms; and a ring-shaped calendar display wheel rotationally driven by the piezoelectric actuator.

Furthermore, according to the present invention, there is provided a portable device comprising: a piezoelectric actuator in any one of the above forms; and a battery for supplying power to the piezoelectric actuator.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

FIG. 4 includes diagrams for explaining a sectional contact state between a rotor and a projection that are components of the piezoelectric actuator.

FIG. 5 is a diagram for explaining another example of the sectional contact state between the rotor and the projection of the piezoelectric actuator.

FIG. 49 is a diagram showing a construction for supplying electric power to a piezoelectric element of the vibrating plate of the piezoelectric actuator according to the second embodiment.

FIG. 50 includes a diagram showing a state in which the vibrating plate of the piezoelectric actuator according to the second embodiment causes a longitudinal vibration, and a diagram showing a state in which the vibrating plate causes a bending vibration.

FIG. 58 is a diagram for explaining a driving direction of a rotor when a vibrating plate in another modification of the piezoelectric actuator according to the fourth embodiment causes a bending vibration.

FIG. 59 are diagrams showing an example of the construction of a driving circuit for switching the vibrating plate in the other modification of the piezoelectric actuator according to the fourth embodiment between a longitudinal vibration mode and a bending vibration mode.

DESCRIPTION OF THE PREFERRED EMBODIMENTS

A description will now be given of embodiments of the present invention with reference to the drawings.

A. First Embodiment

A-1. Overall Construction

Figure 1:
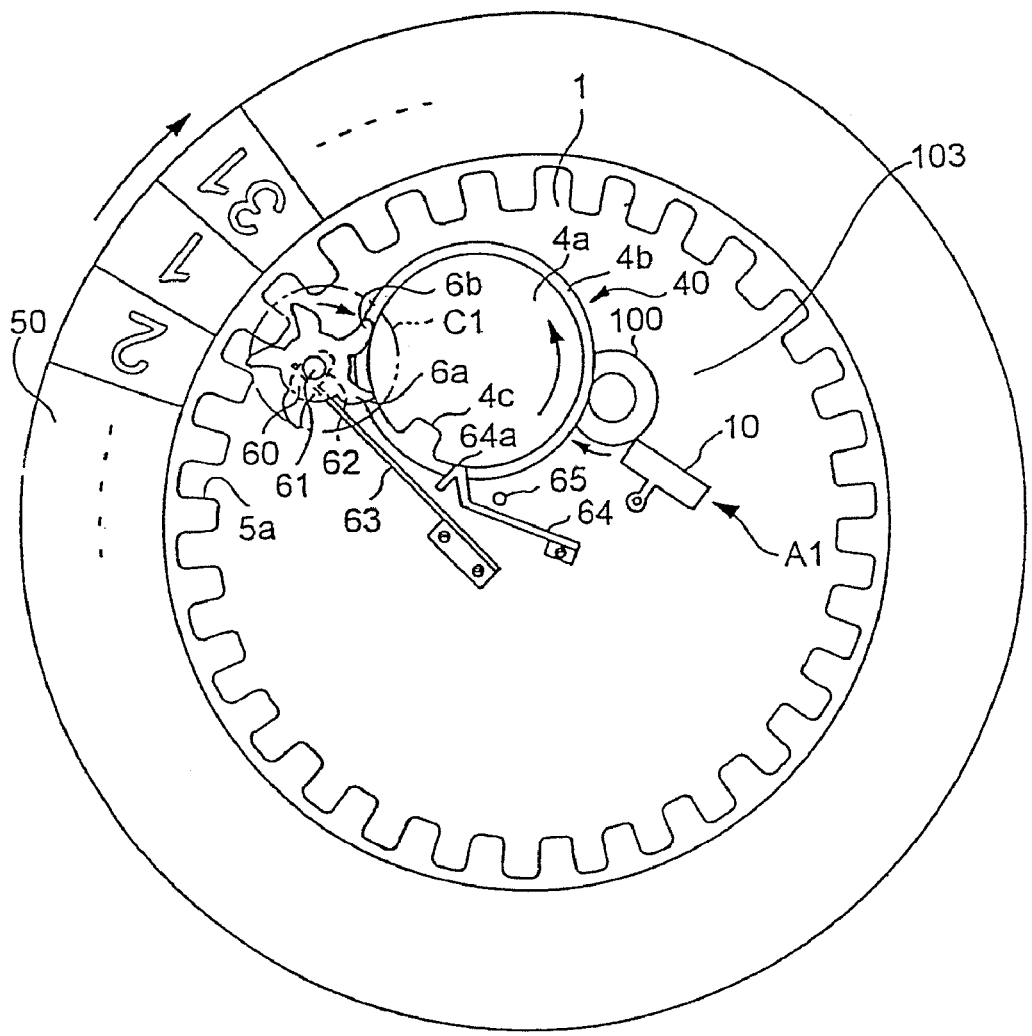
FIG. 1 is a plan view of the principal construction of a calendar display mechanism having a piezoelectric actuator incorporated therein in a timepiece according to a first embodiment of the present invention.

FIG. 1 is a plan view showing the principal construction of a calendar display mechanism having a piezoelectric actuator incorporated therein in a wristwatch according to a first embodiment of the present invention.

A piezoelectric actuator A1 is generally composed of a vibrating plate 10 that extensionally vibrates in an in-plane direction (a direction parallel to the plane of the figure) and a rotor (rotating member) 100. The rotor 100 is rotationally supported on a main plate (support body) 103, and is disposed at a position where it abuts against the vibrating plate 10. When its outer peripheral surface is tapped by vibrations generated in the vibrating plate 10, the rotor 100 is rotationally driven in a direction shown by the arrow in the figure.

Next, a calendar display mechanism is coupled to the piezoelectric actuator A1, and is driven by a driving force thereof. The principal part of the calendar display mechanism is generally composed of a speed-reducing wheel train for decelerating the rotation of the rotor 100, and a ring-shaped date indicator 50. The deceleration wheel train includes an intermediate date wheel 40 and a date indicator driving wheel 60.

Here, when the vibrating plate 10 vibrates in the in-plane direction as described above, the rotor 100 abutting against the vibrating plate 10 is rotated in a clockwise direction. The rotation of the rotor 100 is transmitted to the date indicator driving wheel 60 via the intermediate date wheel 40, and the date indicator driving wheel 60 rotates the date indicator 50 in a clockwise direction. In this way, the transmittance of all forces from the vibrating plate 10 to the rotor 100, from the rotor 100 to the speed-reducing wheel train, and from the speed-reducing wheel train to the date indicator 50 is effected in the in-plane direction. For this reason, the thickness of the calendar display mechanism can be reduced.

Figure 2:
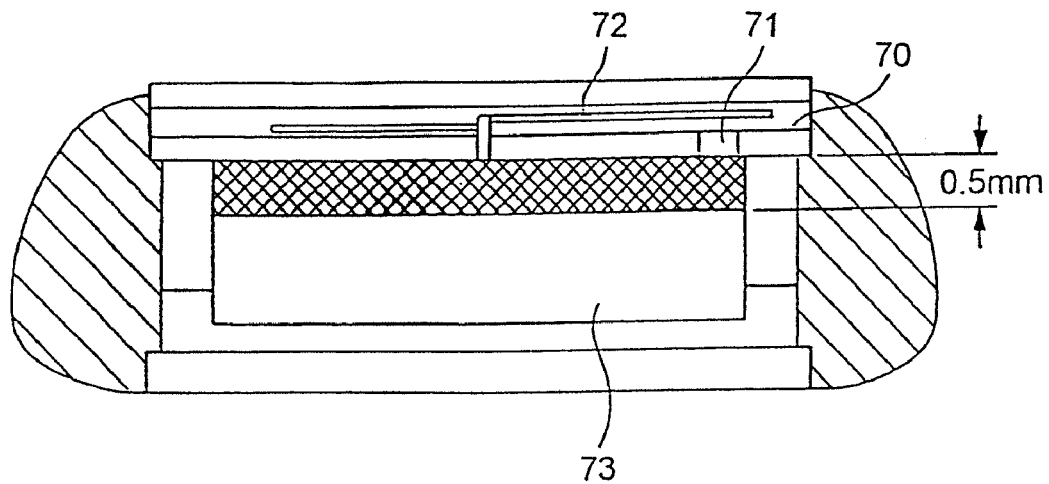
FIG. 2 is a sectional side elevation schematically showing the construction of the timepiece according to the embodiment.

FIG. 2 is a sectional view of a timepiece according to the first embodiment of the present invention. In the figure, a calendar mechanism including the above-described piezoelectric actuator A1 is incorporated into the hatched region, and the thickness thereof is considerably thin at about 0.5 mm. A disk-like dial 70 is provided above the calendar display mechanism. A window 71 for displaying the date is provided in a part of the outer periphery of the dial 70 so that the date of the date indicator 50 can be seen through the window 71. In addition, a movement 73 for driving hands 72, and a driving circuit (not shown), which will be described later, are provided below the dial 70.

In the construction as described above, the piezoelectric actuator A1 has a construction in which a coil and a rotor are not stacked in the thickness direction as in a conventional stepping motor, but the vibrating plate 10 and the rotor 100 are disposed in the same plane. For this reason, it is structurally suited to a reduction in thickness. For this reason, the thickness of the calendar display mechanism can be reduced, and the thickness of the entire timepiece can be reduced. Furthermore, the movement 73 can be shared between a timepiece with the calendar display mechanism and a timepiece without such a display mechanism, whereby productivity can be improved.

A-2. Construction of Piezoelectric Actuator

Figure 3:
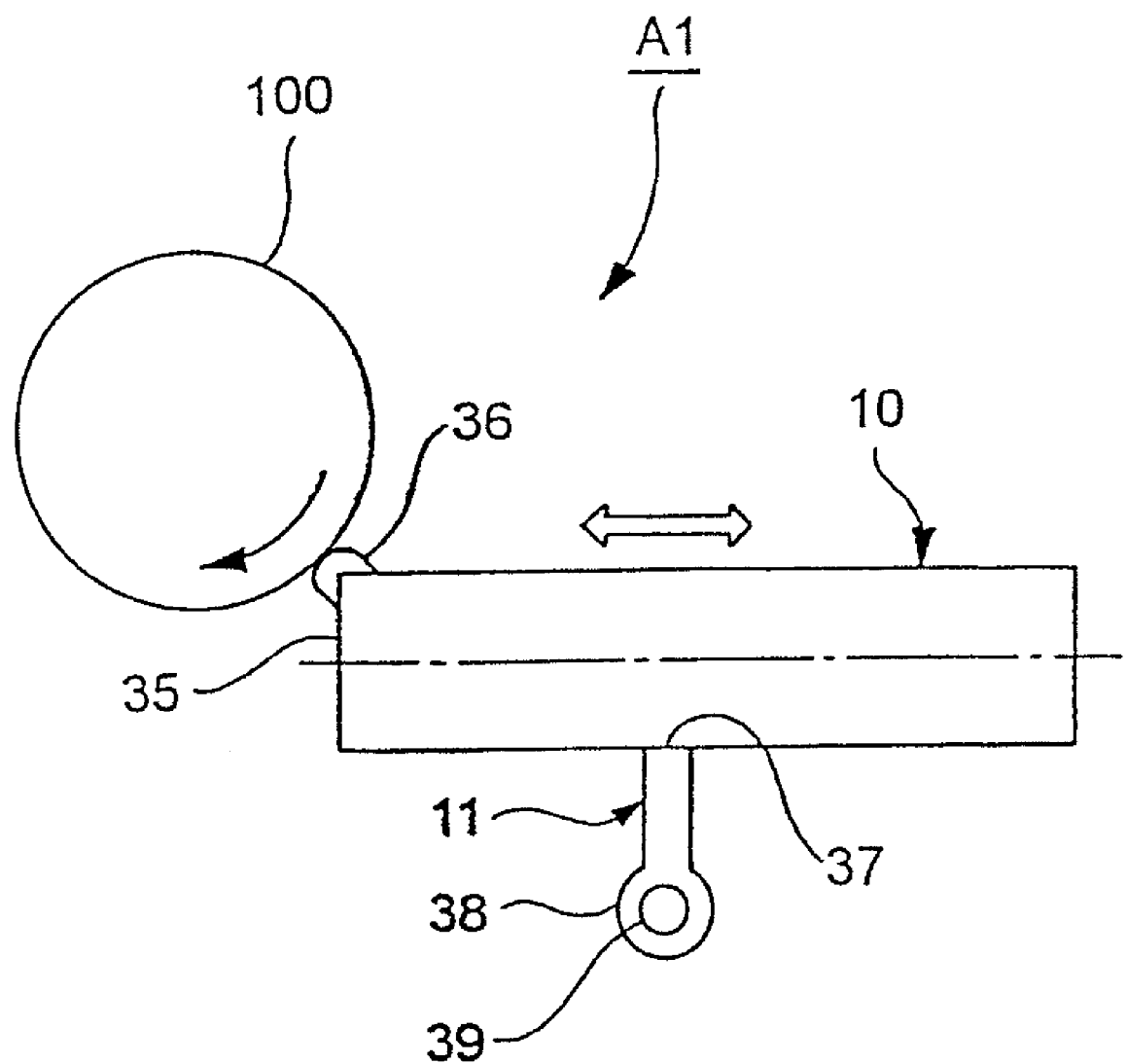
FIG. 3 is a plan view showing the overall construction of the piezoelectric actuator.

Next, a description will be given of the piezoelectric actuator A1 according to this embodiment. As shown in FIG. 3, the piezoelectric actuator A1 includes a long plate-like vibrating plate 10 that is elongated in the lateral direction in the figure, and a support member 11 for supporting the vibrating plate 10 on the main plate 103 (see FIG. 1).

At a longitudinal end 35 of the vibrating plate 10, a projection 36 is projected toward the rotor 100, and the projection 36 is in contact with the outer peripheral surface of the rotor 100. With the provision of such a projection 36, an operation such as grinding may be performed only on the projection 36 in order to maintain the state of the contact surface between the projection 36 and the rotor 100, so that the contact surface between the projection 36 and the rotor 100 can be easily controlled. In addition, the projection 36 formed of a conductive member or a non-conductive member may be used. When the projection 36 is formed of a non-conductive member, piezoelectric elements 30 and 31 can be prevented from shorting even if they come into contact with the rotor 100 that is generally formed of metal.

As shown in the figure, in this embodiment, the projection 36 is formed in the shape of a curved surface projecting toward the rotor 100 in plane view. By forming the projection 36 abutting against the rotor 100 in the shape of a curved surface in this way, even if the positional relationship between the rotor 100 and the vibrating plate 10 varies (due to variations in size and the like), the contact state between the outer peripheral surface of the rotor 100 that is a curved surface and the projection 36 formed in the shape of a curved surface does not change so much. Therefore, a stable contact state between the rotor 100 and the projection 36 can be maintained.

As shown in FIG. 4(a), in this embodiment, the projection 36 is formed in the shape of a curved surface projecting toward the rotor 100 in sectional view. On the other hand, a concave surface 100a in the shape of a curved surface is formed in the outer peripheral surface of the rotor 100 so that the projection 36 and the concave surface 100a in the shape of a curved surface contact each other. Since the sectional contacting structure is such that a curved surface contacts a curved surface, a good contact state can be maintained even if the contact angle between the projection 36 and the rotor 100 varies. For example, as shown in FIG. 4(b), if the outer peripheral surfaces of the projection 36 and the rotor 100 are formed in the shape of straight lines, the contact state is greatly changed by merely a slight variation of the contact angle. Here, although a guide member for guiding the projection 36 may be provided in order to maintain the contact angle constant, such a construction causes an increase in the number of components that increases the cost. Therefore, by forming the projection 36 and the concave surface 100a in the shape of curved surfaces, as in this embodiment, a good contact state can be maintained without causing a substantial increase in cost. In addition, disengagement of the projection 36 from the concave surface 100a can be restrained. Not only the concave surface 100a in the shape of a curved surface but also a V-groove 100b may be formed in the outer peripheral surface of the rotor 100, as shown in FIG. 5. In this case, variations of the contact angle between the projection 36 and the rotor 100, and the disengagement of projection 36 from the V-groove 100b can also be reduced.

Returning to FIG. 3, one end portion (mounting portion) 37 of the support member 11 is mounted on the vibrating plate 10 at a portion slightly toward the rotor 100 from the longitudinal center thereof. The other end (fixed portion) 38 of the support member 11 is supported on the main plate 103 (see FIG. 1) by a screw 39. In such a construction, the support member 11 supports the vibrating plate 10 in a state of urging, by its elastic force, toward the rotor 100, whereby the projection 36 of the vibrating plate 10 is brought into abutment with the side surface of the rotor 100.

Figure 6:
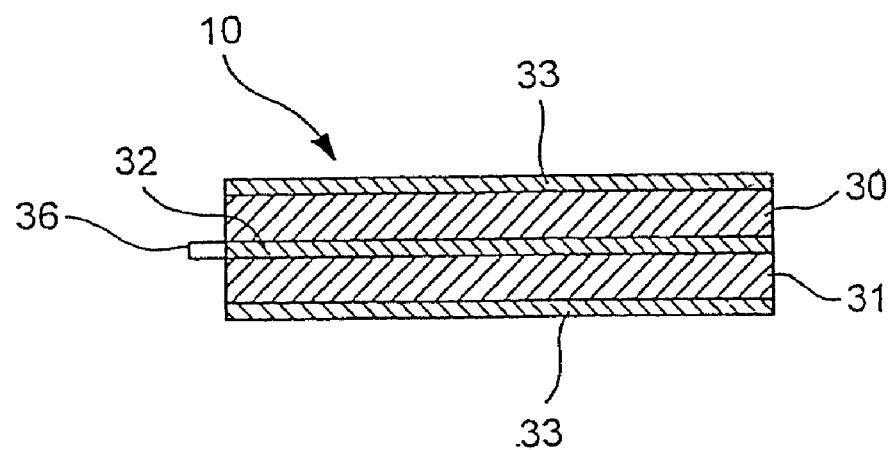
FIG. 6 is a sectional side elevation showing a vibrating plate that is a component of the piezoelectric actuator.

As shown in FIG. 6, the vibrating plate 10 has a stacked structure in which a reinforcing plate 32, such as stainless steel, having substantially the same shape as the piezoelectric elements 30 and 31, and having a thickness smaller than that of the piezoelectric elements 30 and 31, is arranged between the two rectangular piezoelectric elements 30 and 31. By arranging the reinforcing plate 32 between the piezoelectric elements 30 and 31 in this way, damage of the vibrating plate 10 due to the excessive vibration of the vibrating plate 10 or an external force can be reduced. In addition, the reinforcing plate 32 having a thickness smaller than that of the piezoelectric elements 30 and 31 is used so as to allow as much vibration as possible of the piezoelectric elements 30 and 31.

Electrodes 33 are disposed on the surfaces of the piezoelectric elements 30 and 31 that are disposed at the upper and lower side surfaces. A voltage is supplied from a conductive construction, which will be described later, to the piezoelectric elements 30 and 31 via the electrodes 33. Here, as the piezoelectric elements 30 and 31, various types of substances can be used, such as lead zirconate titanate (PZT(trademark), quartz, lithium niobate, barium titanate, lead titanate, lead metaniobate, polyvinylidene fluoride, zinc lead niobate ((Pb(Zn1/3-Nb2/3)O3 1-x-Pb Ti O3 x), wherein x varies with the composition, and x is about 0.09), and scandium lead niovate ((Pb((Sc1/2Nb1/2)1-x Tix))O3), wherein x varies with the composition, and x is about 0.09).

In addition, in this embodiment, each of the electrodes 33 is formed with a thickness of 0.5 μm or more. Electrodes each having a thickness of about 0.1 to 0.3 μm are usually formed on such a piezoelectric element. In the piezoelectric actuator A1, however, electrodes thicker than common electrodes are formed, whereby the electrodes 33 serve the function of a reinforcing material against bending in addition to the function of the electrode so as to improve the strength of the vibrating plate 10. Here, although the strength is improved when the thickness of each of the electrodes 33 is increased, an excessive increase in the thickness will prevent the vibration of the vibrating plate 10. Therefore, when the improvement of the strength and the influence on the vibration are considered, the thickness of each of the electrodes 33 may preferably be 0.5 μm or more, and the sum of the thicknesses of the electrodes 33 formed on the upper and lower surfaces may preferably be the thickness of the reinforcing plate 32 or less. In the case of the piezoelectric actuator A1 to be incorporated into the calendar display mechanism of the wristwatch as in this embodiment, when the reduction in thickness, the influence on the vibration, and the strength and the like are considered, the thickness of the reinforcing plate 32 may be about 0.1 mm. Therefore, in this case, the sum of the thicknesses of the electrodes 33 may be 0.1 mm or less.

Figure 7:
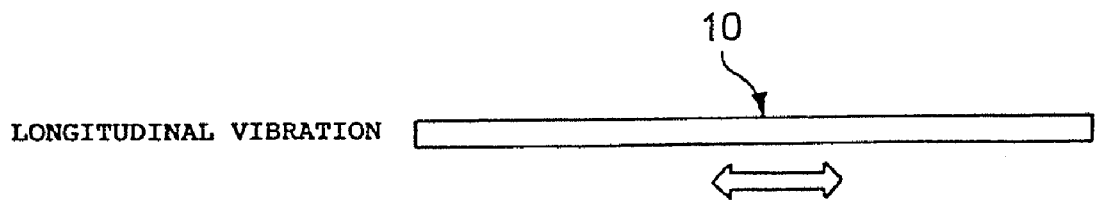
FIG. 7 is a diagram showing a state in which the vibrating plate causes a longitudinal vibration.
Figure 8:
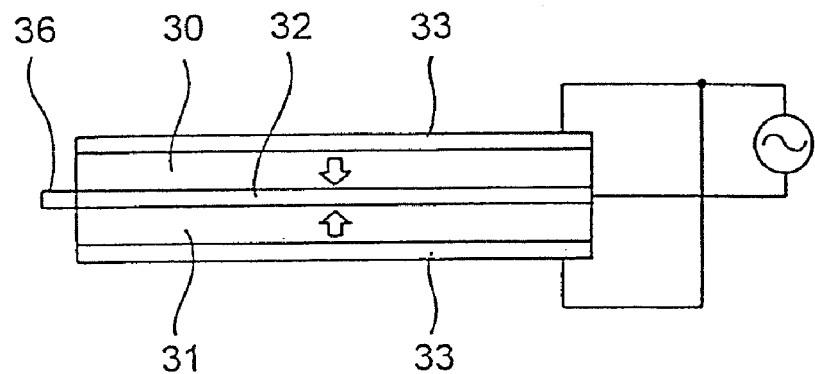
FIG. 8 is a block diagram showing the outline of the construction for supplying electric power to a piezoelectric element of the vibrating plate.
Figure 9:
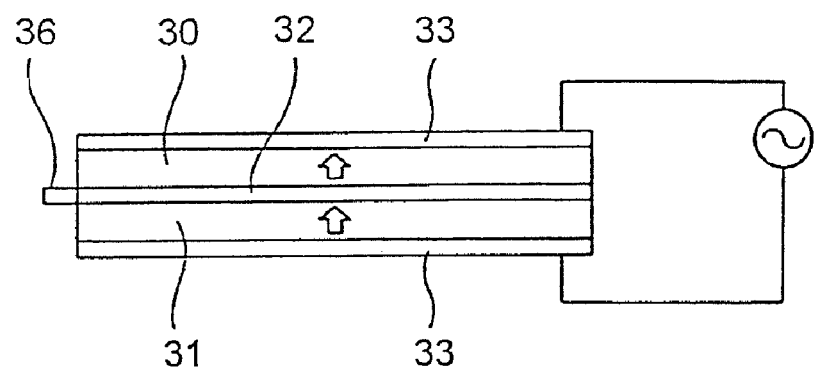
FIG. 9 is a block diagram showing the outline of another construction for supplying electric power to the piezoelectric element of the vibrating plate.

When an alternating voltage is applied from a driving circuit, which will be described later, to the piezoelectric elements 30 and 31 via the electrodes 33, the thus-constructed vibrating plate 10 vibrates as the piezoelectric elements 30 and 31 expand and contract. In this case, the vibrating plate 10 causes a longitudinal vibration such that it expands and contracts in the longitudinal direction, as shown in FIG. 7, whereby the vibrating plate 10 vibrates in the direction shown by a bi-directional arrow in FIG. 3 (an unloaded state, that is, a state in which the projection 36 is not in contact with the rotor 100). In addition, as shown in FIG. 8, the vibrating plate 10 has a structure in which the long plate-like piezoelectric elements 30 and 31 are stacked, and the piezoelectric elements 30 and 31 are driven while being connected in parallel so that they are polarized in opposite directions (shown by the arrow in the figure), whereby the amplitude of vibration caused by the vibrating plate 10 can be amplified, and a greater displacement can be obtained. On the other hand, if the piezoelectric elements 30 and 31 are driven while being connected in series so that they are polarized in the same direction, as shown in FIG. 9, the vibrating plate 10 can be vibrated with a low current. Therefore, the connecting structure of the piezoelectric elements 30 and 31 may be determined in accordance with the conditions of using the piezoelectric actuator A1 (when an increase in displacement is regarded as important, or when a reduction in power consumption is regarded as important).

A-3. Operation of Piezoelectric Actuator

Next, a description will be given of the operation of the piezoelectric actuator constructed as described above. Firstly, when a voltage is applied to the vibrating plate 10 from a driving circuit (not shown), the vibrating plate 10 causes a flexural vibration as the piezoelectric elements 30 and 31 expand and contract, and vibrates in the direction of the arrow with the projection 36 abutting against the rotor 100, as shown in FIG. 3. The rotor 100 is rotated in the direction of the arrow in accordance with the displacement of the projection 36 caused by the vibration. The rotor 100 is rotated in this way, whereby the date indicator 50 is rotated via the intermediate date wheel 40 (see FIG. 1), and the date and the day to be displayed are changed.

Figure 10:
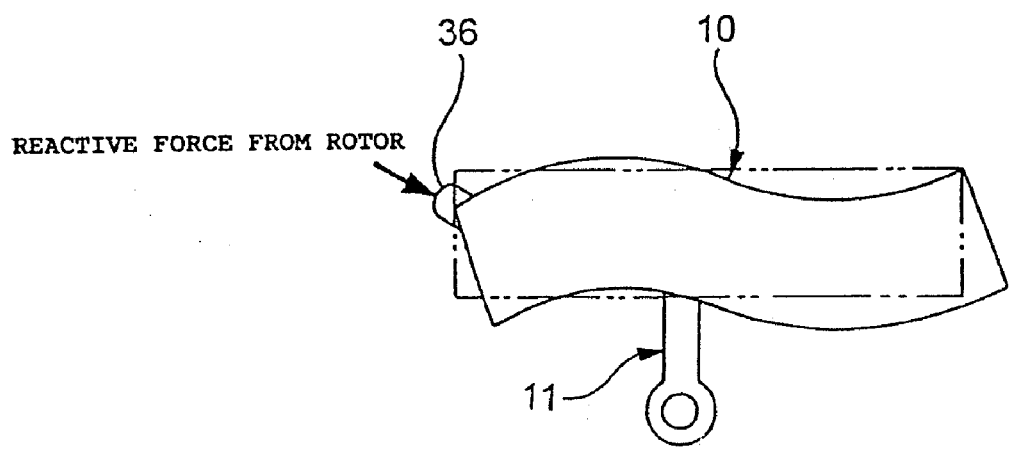
FIG. 10 is a diagram for explaining a state in which, when the vibrating plate vibrates, it causes a bending vibration by a reaction force from the rotor.
Figure 11:
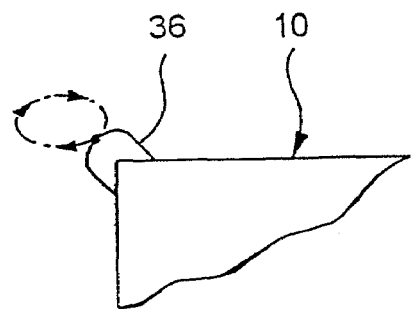
FIG. 11 is a diagram for explaining the orbit of the projection during the bending vibration.

Here, in the piezoelectric actuator A1, the projection 36 abutted against the rotor 100 is provided at a position shifted from the center line shown by a one-dot chain line in FIG. 3 in the widthwise direction (vertical direction in FIG. 3) of the vibrating plate 10. Therefore, a bending vibration shown in FIG. 10 is generated in the vibrating plate 10 by a reaction force from the side surface of the rotor 100. If the above-described bending vibration is induced in addition to the longitudinal vibrations of the piezoelectric elements 30 and 31 caused by the application of a voltage, the projection 36 moves along an elliptical orbit, as shown in FIG. 11. That is, if the bending vibration is excited in addition to the longitudinal vibration, a greater displacement can be obtained. If the displacement of the projection 36 can be amplified in this way, driving efficiency of the rotor 100 that is driven in accordance with the displacement can be improved. The position where the projection 36 is provided is not limited to the position shown in the figure, and the projection 36 may be provided at a position where a bending vibration can be induced in the substantially rectangular vibrating plate 10 by the reaction force of the above-described rotor 100.

Furthermore, if the vibrating plate 10 is used which has a shape such that the resonance frequency of the longitudinal vibration substantially coincides with the resonance frequency of the bending vibration, the projection 36 can be moved along a larger elliptical orbit. If the projection 36 is moved along the large elliptical orbit in this way, the time the projection 36 comes into contact with the rotor 100 is elongated, whereby the displacement of the projection 36 during contact is amplified. Therefore, if a bending vibration that resonates with the longitudinal vibration due to the expansion and contract of the piezoelectric elements 30 and 31 is induced, the driving force can be transmitted with higher efficiency.

Figure 12:
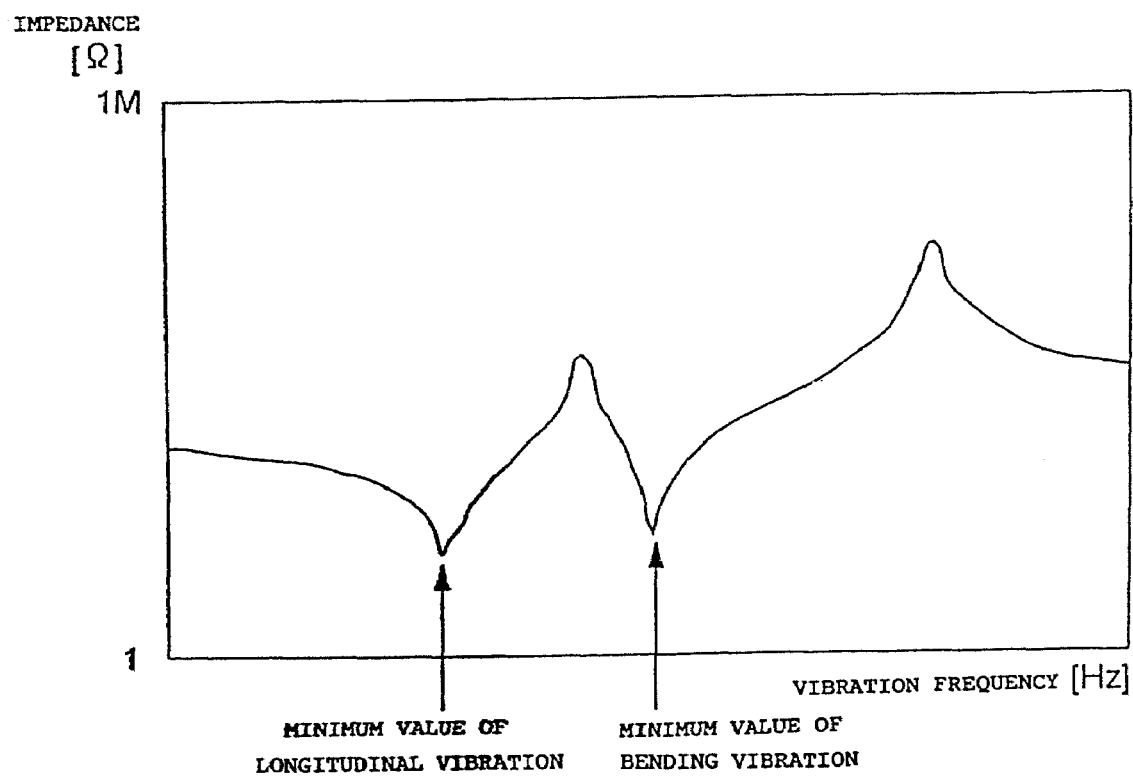
FIG. 12 is a graph showing an example of the relationship between vibration frequency and impedance of the vibrating plate.

As described above, while the vibrating plate that has a shape such that the longitudinal vibration and the bending vibration generated in the vibrating plate 10 resonate may be used, a vibrating plate that has a shape such that the resonance frequency of the bending vibration of the vibrating plate 10 is increased to be slightly higher than the resonance frequency of the longitudinal vibration may be used. If the resonance frequency of the bending vibration is increased to be slightly higher than the resonance frequency of the longitudinal vibration in this way, a bending vibration is generated in the vibrating plate 10, as shown in FIG. 10, whereby the projection 36 can be greatly displaced, and the vibration generated in the vibrating plate 10 can be stabilized. This is because the bending vibration cannot follow the longitudinal vibration when the resonance frequency of the bending vibration generated in accordance with the longitudinal vibration is lower than the resonance frequency of the longitudinal vibration generated by the voltage applied to the piezoelectric elements 30 and 31, and all vibrations generated in the vibrating plate 10 become unstable. In addition, in a vibrating plate in which the resonance frequency of the bending vibration greatly differs from the resonance frequency of the longitudinal vibration, amplitudes of the longitudinal vibration and bending vibration generated in the vibrating plate decrease, whereby driving efficiency is lowered. Therefore, if the resonance frequency of the bending vibration of the vibrating plate is slightly higher than the resonance frequency of the longitudinal vibration, a decrease in the amplitude of the vibration generated in the vibrating plate 10, that is, the displacement of the projection 36, can be restricted, and a stable vibration can be generated. For example, when a vibrating plate having the varying impedance characteristics shown in FIG. 12 was used, it was experimentally recognized that the projection 36 greatly displaced along the above-described elliptical orbit, and a stable vibration was generated in the vibrating plate. In the vibrating plate having the characteristics shown in FIG. 12, the resonance frequency at the minimum value of the impedance of the longitudinal vibration is 284.3 kHz, and the resonance frequency at the minimum value of the impedance of the bending vibration is 288.6 kHz. Therefore, if the vibrating plate 10 in which the resonance frequency of the bending vibration of the vibrating plate 10 is increased to be higher than the resonance frequency of the longitudinal frequency by about 2% is used, the above-described advantages can be obtained. In a case where the resonance frequency of the bending vibration is slightly increased in this way, if the vibrating plate 10 is excited with a frequency between the resonance frequency of the longitudinal vibration and the resonance frequency of the bending vibration, that is, if the piezoelectric elements 30 and 31 are driven with an exciting frequency within such a range, both the longitudinal vibration and the bending vibration can be easily induced, and a vibration such that the elliptical orbit shown in FIG. 11 becomes large can be generated in the vibrating plate 10, whereby the rotor 100 can be rotationally driven with higher efficiency.

While the bending vibration may be induced in the vibrating plate 10 by a reaction force from the rotor 100, as described above, the projection 36 that is an abutment portion of the rotor 100 and the vibrating plate 10 may be elastically deformed in the widthwise direction by a reaction force from the rotor 100 generated by the longitudinal vibration of the vibrating plate 10 so that the projection 36 is moved along the above-described elliptical orbit.

Since the projection 36 is urged toward the rotor 100 by the elastic force of the support member 11 in the piezoelectric actuator A1, sufficient friction can be obtained between the rotor 100 and the projection 36. This reduces slippage of the projection 36 and the rotor 100, whereby a large driving force can be stably transmitted from the projection 36 to the rotor 100.

Since the rotor 100 and the vibrating plate 10 are supported on the main plate 103, which is a single member, the spacing arrangement between them is maintained constant. Therefore, the contact state between the projection 36 and the rotor 100 can be stably maintained, whereby the driving force can be stably transmitted.

Figure 13:
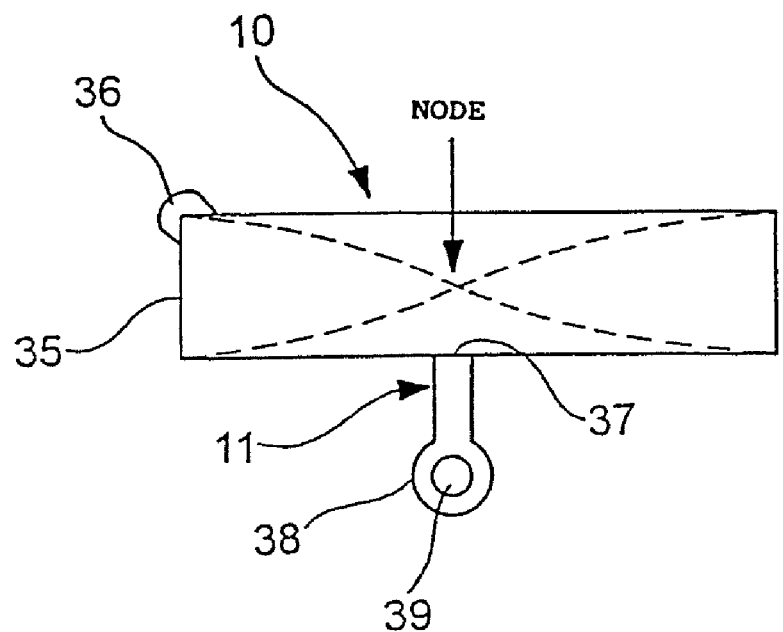
FIG. 13 is a diagram for explaining the amplitude of the vibrating plate during the bending vibration.

In the piezoelectric actuator A1 according to this embodiment, the end 37 of the support member 11 is attached to the vibrating plate 10 at a position of a node of amplitude of the center lines of vibrating plate 10 shown by broken lines in FIG. 13, that is, at a position of minimum amplitude. More specifically, the end 37 is attached to the vibrating plate 10 slightly toward the rotor 100 from the longitudinal central part. This is because while the position of the center of gravity of the vibrating plate 10, i.e., the longitudinal central position of the rectangular vibrating plate 10 is a node of vibration during the unloaded state, the node of vibration of the vibrating plate 10 is actually located toward the rotor 100 from the central part, as shown in FIG. 13 due to the influence of the reaction force and the like from the rotor 100 as described above. The vibrating plate 10 is supported at the position of the node of vibration in this way, whereby loss of vibration energy is decreased and the driving force can be transmitted with higher efficiency. In addition, if the position of a node of vibration of the support member 11 in accordance with the vibration of the vibrating plate 10 is allowed to substantially coincide with the end 37 of the support member 11, the loss of the vibration energy can be further decreased. When the vibrating plate 10 does not have a rectangular shape shown in FIG. 10, the vibrating plate 10 may be supported at a portion toward the rotor 100 from the center of gravity of the vibrating plate 10. This is because the node of the vibration of the vibrating plate 10 is moved toward the rotor 100 from the center of gravity of the vibrating plate 10 by the influence of the reaction force and the like from the rotor 100. The support member 11 may support the vibrating plate 10 at the position of the node.

Furthermore, in the piezoelectric actuator A1 according to this embodiment, the vibrating plate 10 having a structure in which the piezoelectric elements 30 and 31 and the reinforcing plate 32 are stacked can rotationally drive the rotor 100 without using the amplifying member. Therefore, the construction is simplified, and the size of the device can be easily reduced. In addition, mechanical components of the piezoelectric actuator A1 are the vibrating plate 10, the support member 11, and the like, and components are not stacked in the thickness direction (direction perpendicular to the plane of FIG. 1). Therefore, the thickness of the device can be easily reduced.

In addition, in the piezoelectric actuator A1, the rotor 100 is driven only in one direction shown by the arrow in the figure, and another vibrating plate for driving the rotor 100 in the opposite direction, and a mechanism for changing the direction of abutment of the vibrating plate against the rotor 100 are not provided, that is, there are few factors for preventing the vibration of the vibrating plate 10. Therefore, the driving force can be transmitted more efficiently.

Figure 14:
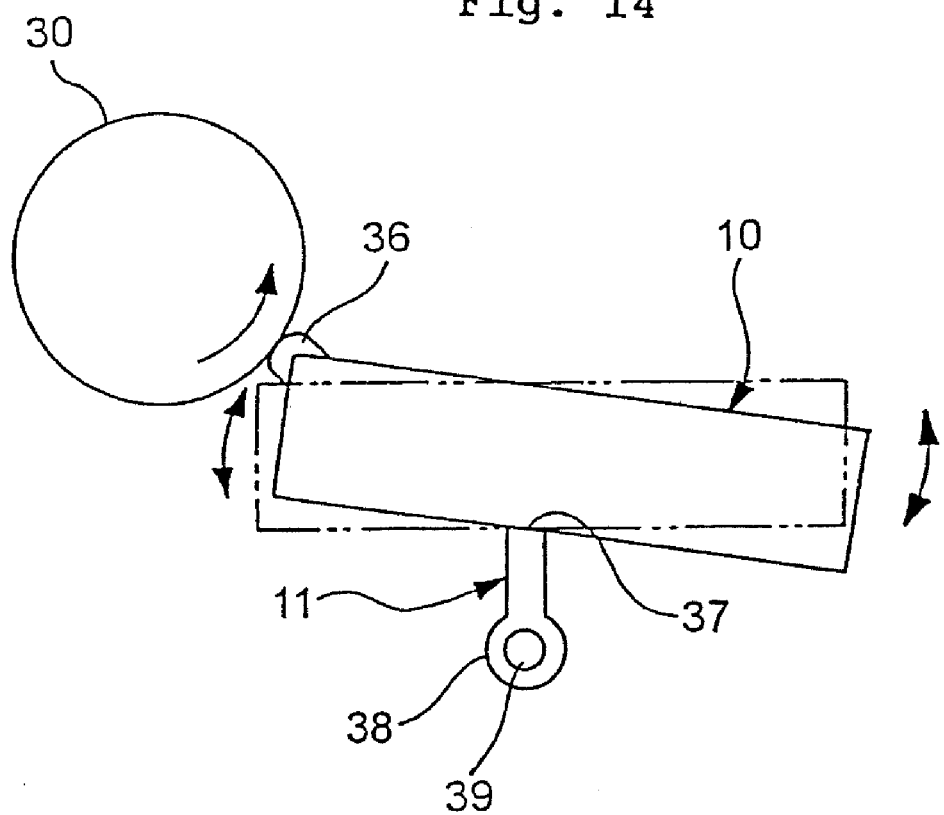
FIG. 14 is a diagram for explaining the operation of the vibrating plate when the rotor is to be rotated in a reverse direction.
Figure 15:
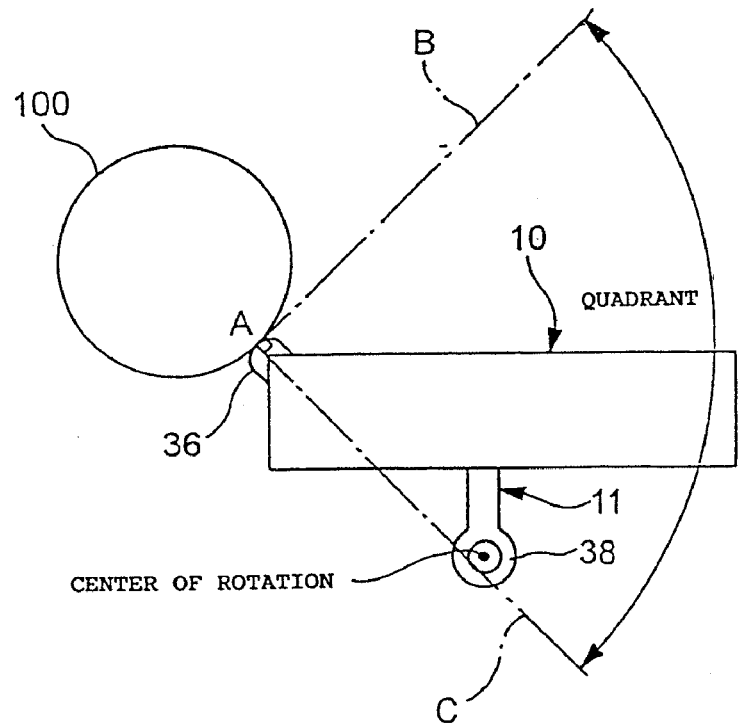
FIG. 15 is a diagram for explaining the position of the center of rotation of a support member for rotationally supporting the vibrating plate.

In the piezoelectric actuator A1 according to this embodiment, since the rotor 100 is driven only in one direction, it is necessary to restrict the rotation of the rotor 100 in the opposite direction. However, when a large external force is applied or a load is increased, the rotor 100 sometimes tends to rotate in the opposite direction against the driving force generated by the vibrating plate 10. For example, when an opposite torque exceeding the frictional force between the projection 36 and the rotor 100 is generated, both of the projection 36 and the rotor 100 slip against each other to allow the rotor 100 to be rotated in the opposite direction. In the piezoelectric actuator A1 according to this embodiment, however, since the support member 11 is not a rigid body but is elastic, as shown in FIG. 14, when a force which tends to rotate the rotor 100 in the opposite direction increases and the rotor 100 is pushed back in the opposite direction, the rotation of the rotor 100 in the opposite direction and the rotation of the vibrating plate 10 with the projection 36 contacting the rotor 100 are allowed. As shown in FIG. 15, in this embodiment, the center of rotation allowed for the vibrating plate 10 is set to be located within a quadrant formed by the line B extending from the contact point A of the rotor 100 and the projection 36 in a direction opposite to the driving direction of the rotor 100 at the point A and the line C intersecting the line B at right angles on the point A. That is, the rotation of the vibrating plate 10 around the end 38 of the support member 11 located within the above-described quadrant is allowed. By providing the center of rotation at such a position, when the vibrating plate 10 is rotated clockwise in the figure in accordance with the opposite rotation of the rotor 100, the projection 36 is displaced toward the rotor 100 as if to cut into the rotor 100. Therefore, the force of the projection 36 pressing against the rotor 100 is increased, whereby the friction between the projection 36 and the rotor 100 is increased. This makes it possible to transmit a large torque (for the normal rotation) from the vibrating plate 10, whereby the rotation of the rotor 100 in the opposite direction due to an increase in load and the external force can be inhibited. That is, when the load is increased, the driving torque can be increased corresponding to the increase in the load. When the force in the opposite direction is eliminated or decreased, the vibrating plate 10 is returned to the lower position shown by the one-dot chain line in FIG. 14 by the elastic force of the support member 11.

Figure 16:
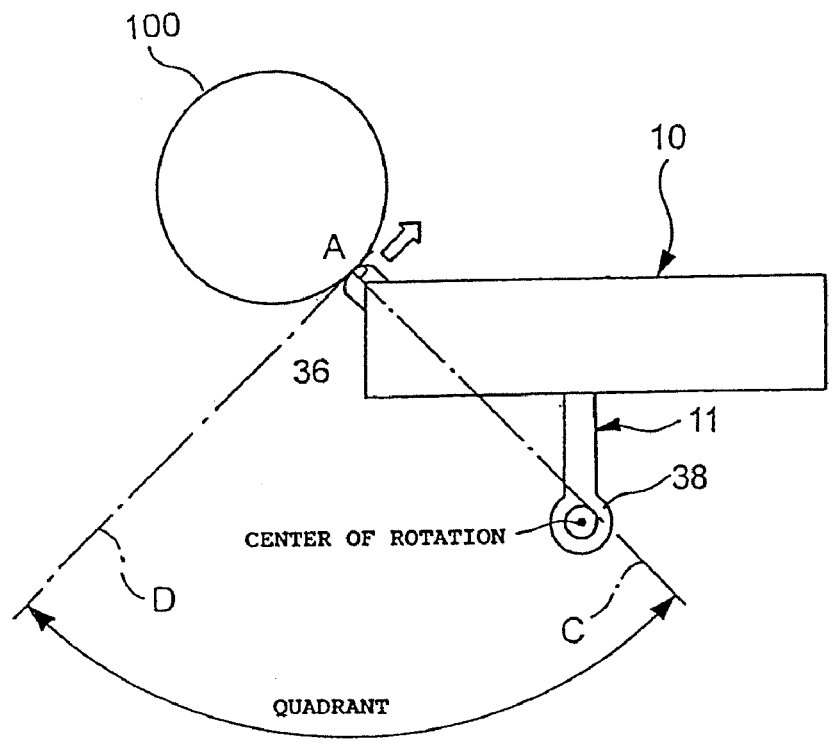
FIG. 16 is a diagram for explaining another example of the position of the center of rotation of the support member for rotationally supporting the vibrating plate.

In addition to the increase in friction between the projection 36 and the rotor 100, when the rotor 100 tends to rotate in the opposite direction, the vibrating plate 10 may be rotated so that the projection 36 moves away in a direction opposite to the driving direction shown by the arrow in accordance with the movement of the rotor 100, as shown in FIG. 16. In order to rotate the vibrating plate 10 in this way, the center of rotation of the vibrating plate 10 may be set to be located within a quadrant formed by the line D extending from the contact point A of the rotor 100 and the projection 36 in the driving direction of the rotor 100 at the point A and the line C intersecting the line D at right angles on the point A. This makes it possible to rotate the vibrating plate 10 so that the projection 36 moves away as described above, whereby damage of the rotor 100 and the projection 36 due to the external force and the like can be reduced.

A-4. Construction of Calendar Display Mechanism

Figure 17:
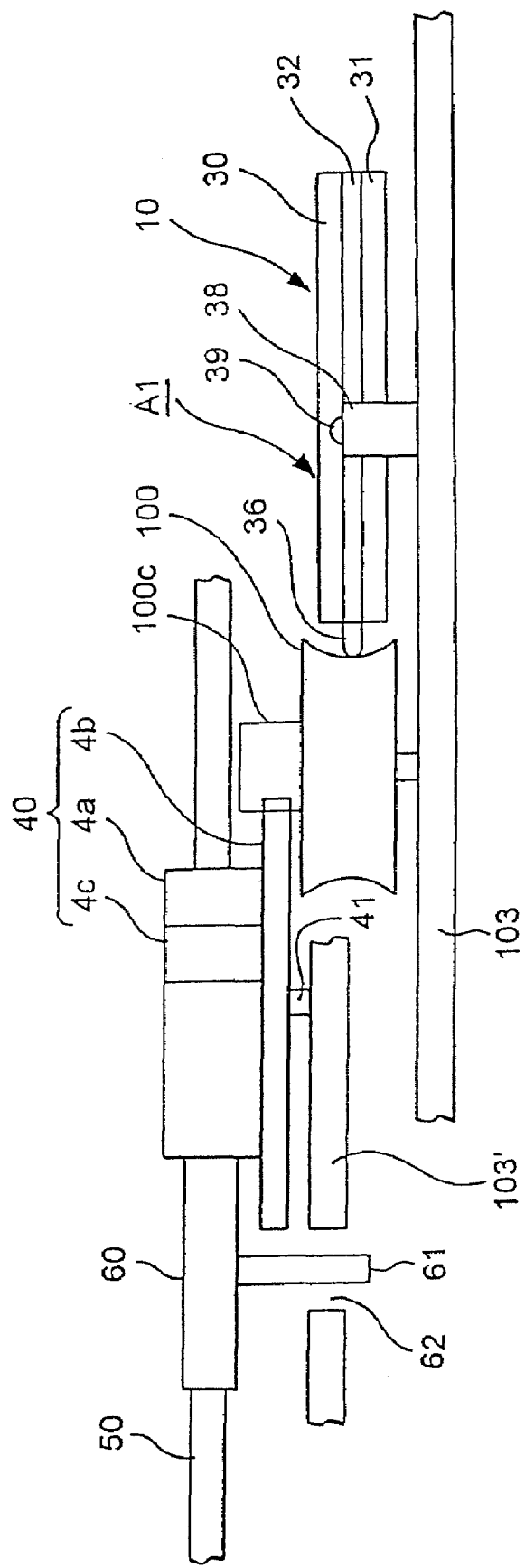
FIG. 17 is a sectional side elevation showing a principal construction of the calendar display mechanism.

Next, a description will be given of the construction of the calendar display mechanism with reference to FIG. 1 and FIG. 17, which is a sectional view of FIG. 1. In the figures, the main plate 103 is a first bottom plate for arranging parts thereon, and a main plate 103' is a second bottom plate partially having a stepped portion with respect to the main plate 103. A gear 100c that is coaxial with the rotor 100 and is rotated with the rotor 100 is provided above the rotor 100. The intermediate date wheel 40 is composed of a large diameter section 4b and a small diameter section 4a that is fixed so as to be concentric with the large diameter section 4b and is formed slightly smaller than the large diameter section 4b. In accordance with the rotation of the gear 100c with the rotor 100, the large diameter section 4b that meshes with the gear 100c is rotated, whereby the intermediate wheel 40 is rotated. A peripheral surface of the small diameter section 4a is cut out in substantially a square shape to form a cutout 4c. A shaft 41 of the intermediate date wheel 40 is formed on the main plate 103', and a bearing (not shown) coupled to the shaft 41 is formed inside the intermediate date wheel 40. Therefore, the intermediate date wheel 40 rotationally provided on the main plate 103'. The rotor 100 also has a bearing (not shown) formed inside thereof, and is rotationally supported on the main plate 103.

Next, the date indicator 50 is formed in the shape of a ring, and an internal gear 5a is formed on the inner peripheral surface thereof. The date indicator driving wheel 60 has a gear of five teeth, and meshes with the internal gear 5a. A shaft 61 is provided in the center of the date indicator driving wheel 60 to rotationally support the date indicator driving wheel 60. The shaft 61 is loosely inserted into a through hole 62 formed in the main plate 103'. The through whole 62 is elongated along the circumferential direction of the date indicator 50.

One end of a plate spring 63 is fixed to the main plate 103', and the other end is fixed to the shaft 61. This allows the plate spring 63 to urge the shaft 61 and the date indicator driving wheel 60. Swinging of the date indicator 50 is prevented by the urging action of the plate spring 63.

One end of a plate spring 64 is secured to the main plate 103' by a screw, and the other end is bent in substantially a V shape to form an end part 64a. A contact 65 is arranged so as to come into contact with the plate spring 64 when the intermediate date wheel 40 is rotated and the end part 64a enters into the cutout 4c. A predetermined voltage is applied to the plate spring 64, and the voltage is also applied to the contact 65 upon contacting the contact 65. Therefore, by detecting the voltage of the contact 65, a date feed state can be detected. A manual driving wheel meshing with the internal gear 5a may be provided so that the date indicator 50 is driven when a user performs a predetermined operation on a crown (not shown).

A-5. Operation of Calendar Display Mechanism

A description will be given of an automatic calendar-updating operation with reference to FIG. 1. When it is twelve o'clock midnight each day, this is detected, and a driving signal V is supplied to the piezoelectric elements 30 and 31 from a driving circuit 500, which will be described later. Then, the vibrating plate 10 vibrates as described above. This makes the rotor 100 rotate in a clockwise direction, and, following this, the intermediate date wheel 40 starts rotation in a counterclockwise direction.

Here, the driving circuit 500 is constructed so as to stop the supply of the driving signal V when the plate spring 64 comes into contact with the contact 65. In a state where the plate spring 64 is in contact with the contact 65, the end portion 64a enters into the cutout 4c. Therefore, the intermediate date wheel 40 starts to rotate.

Since the date indicator driving wheel 60 is urged in a clockwise direction by the plate spring 63, the small diameter section 4a is rotated while sliding on teeth 6a and 6b of the date indicator driving wheel 60. When the cutout 4c reaches the position of the tooth 6a of the date indicator driving wheel 60 during the rotation, the tooth 6a meshes with the cutout 4c. In this case, the circumscribed circle of the date indicator driving wheel 60 has moved to the position shown by C1.

When the intermediate date wheel 40 is continuously rotated in a counterclockwise direction, the date indicator driving wheel 60 is rotated in a clockwise direction by one tooth, that is, by "⅕" of a revolution operatively associated with the intermediate date wheel 40. Furthermore, the date indicator 50 is rotated in a clockwise direction by one tooth (equivalent to the date range for one day) operatively associated with the rotation of the date indicator driving wheel 60. In the final day of a month having a number of days less than "31", the above operation is repeated a plurality of times, and the correct date based on a calendar is displayed by the date indicator 50.

When the intermediate date wheel 40 is continuously rotated in a counterclockwise direction, and the cutout 4c reaches the end part 64a of the plate spring 64, the end 64a enters into the cutout 4c. Then, the plate spring 64 comes into contact with the contact 65, the supply of the driving signal V is stopped, and the rotation of the intermediate date wheel 40 is stopped. Therefore, the intermediate date wheel 40 is rotated once a day.

Incidentally, the load of the piezoelectric actuator A1 increases during 1) a first period (start of rotation) until the end 64a of the plate spring 64 gets out of the state where it is in the cutout 4c, and 2) a second period in which the cutout 4c meshes with the date indicator driving wheel 60 to rotate the date indicator 50. When the load of the piezoelectric actuator A1 increases, slippage between the rotor 100 and the projection 36 is increased, and in the worst case, it becomes impossible to drive the rotor. In the mechanism of this embodiment, however, the first period and the second period do not overlap each other. That is, the maximum torque time required for detecting the date feed state and the maximum torque time required for driving the date indicator 50 are staggered. Therefore, the peak current of the piezoelectric actuator A1 can be suppressed, and consequently, the timepiece can be positively operated by maintaining the power source voltage above a certain voltage value.

A-6. Driving Circuit

Figure 18:
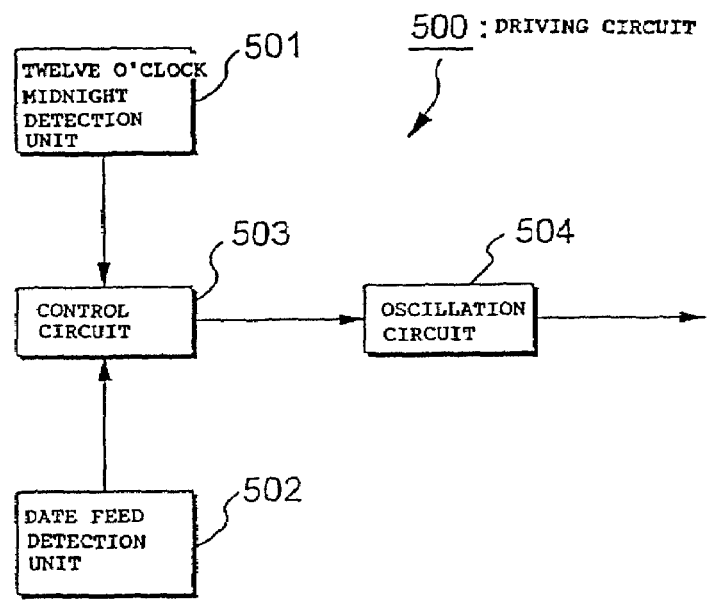
FIG. 18 is a block diagram showing the construction of a driving circuit of the calendar display mechanism.
Figure 19:
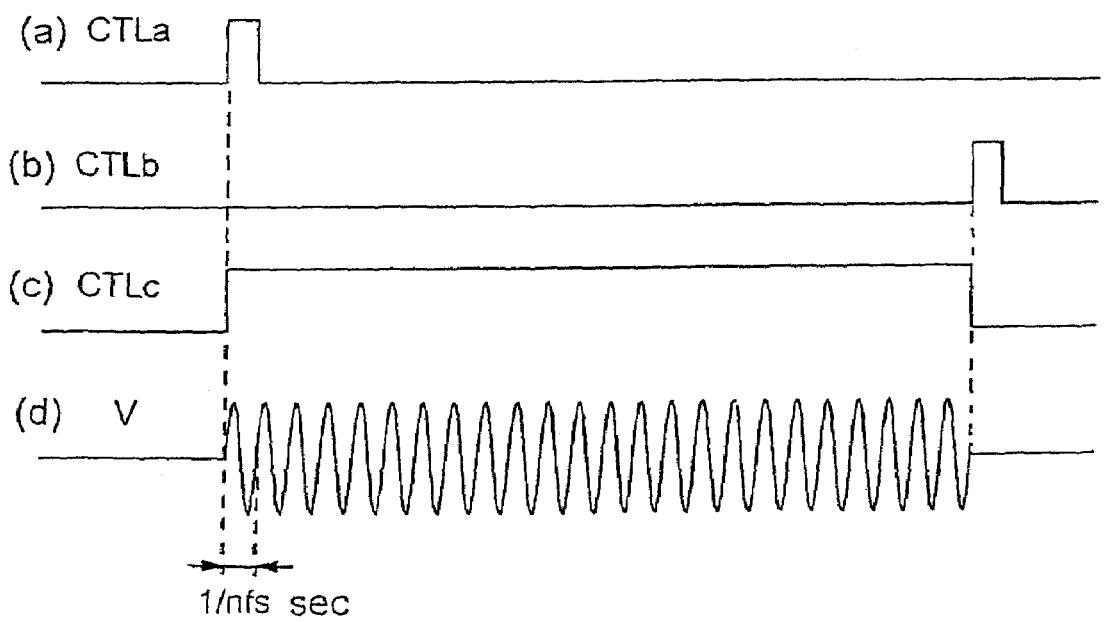
FIG. 19 is a timing chart showing the operation of the driving circuit.

FIG. 18 is a block diagram of the driving circuit 500 for applying a voltage to the piezoelectric elements 30 and 31, and FIG. 19 is a timing chart of the driving circuit 500. A twelve o'clock midnight detection unit 501 is a mechanical switch incorporated in the movement 73 (see FIG. 2), and outputs a first control pulse CTLa shown in FIG. 19(a) when it is twelve o'clock midnight. A date feed detection unit has the above-described plate spring 64 and the contact 65 as principal sections, and outputs a second control pulse CTLb shown in FIG. 19(b) when the plate spring 64 comes into contact with the contact 65.

A control circuit 503 generates an oscillation control signal CTLc (see FIG. 19©) based on the first control pulse CTLa and the second control pulse CTLb. The control circuit 503 may be composed of, for example, an SR flip flop so that the first control pulse CTLa is supplied to set terminals, and the second control pulse CTLb is supplied to reset terminals. In this case, as shown in FIG. 19©, when the first control pulse CTLa rises from a low level to a high level, the oscillation control signal CTLc changes from a low level to a high level, and this state is maintained until the second control pulse CTLb rises, when it changes from the high level to the low level.

The oscillation circuit 504 is constructed so that an oscillation frequency is substantially equal to fs(n) wherein n represents the order of the vibration mode of the vibrating plate 10. The oscillation circuit 504 may be formed by, for example, a Colpitts oscillation circuit.

Power supplied to the oscillation circuit 504 is controlled by the oscillation control signal CTLc. The power supply is effected when the oscillation control signal CTLc is at the higher level, and is stopped when the oscillation control signal CTLc is at the lower level. Therefore, a waveform of the driving signal V, which is an output of the oscillation circuit 504, oscillates when the oscillation control signal CTLc is at a higher level, as shown in FIG. 19(d).

While the intermediate date wheel 40 is rotated once a day as described above, the period thereof is limited, starting from twelve o'clock midnight. Therefore, the oscillation circuit 504 may sufficiently oscillate only during the period. In the driving circuit 50 of this embodiment, the power supply to the oscillation circuit 504 is controlled by the oscillation control signal CTLc to thereby completely stop the operation of the oscillation circuit 504 during a period in which there is no need for rotating the intermediate date wheel 40. Therefore, power consumption of the oscillation circuit 504 can be reduced.

A-7. Modifications of Piezoelectric Actuator

In place of the piezoelectric actuator A1 having the construction as described above, it is possible to use the following variously modified piezoelectric actuators, and it is also possible to use a piezoelectric actuator formed as a combination of the modifications.

A-7-1. First Modification

Figure 20:
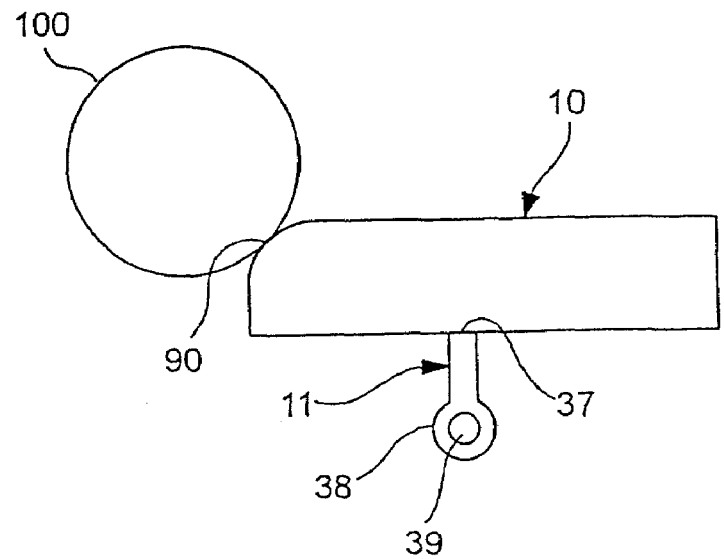
FIG. 20 is a plan view showing a first modification of the piezoelectric actuator.

While the projection 36 is provided on the vibrating plate 10 at a contacting part between the projection 36 and the rotor 100 in the piezoelectric actuator A1 shown in the above-described embodiment, a cutout 90 may be formed by cutting out a peak of a rectangular vibrating plate 10 on the side of the rotor 100 so that the cutout 90 is brought into abutment with the side surface of the rotor 100, as shown in FIG. 20. In this case, a surface state of the cutout 90 can be easily controlled in a manner similar to the above-described projection 36. By forming the cutout 90 in the shape of a curved surface, a good contact state can be maintained in a manner similar to the above-described piezoelectric actuator A1.

A-7-2. Second Modification

Figure 21:
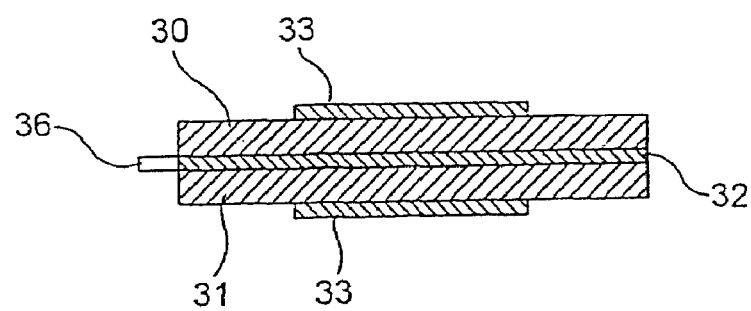
FIG. 21 is a sectional side elevation of a vibrating plate of a second modification of the piezoelectric actuator.

While the electrodes 33 are provided on the entire surfaces of the piezoelectric elements 30 and 31 in the above-described embodiment, electrodes 33 may be disposed only near the longitudinal central parts of the piezoelectric elements 30 and 31 and may not be disposed on both ends, as shown in FIG. 21. That is, the piezoelectric elements 30 and 31 may be constructed so as to have electrode sections having electrodes on the surfaces thereof, and non-electrode sections located on both ends of the electrode sections. This construction makes it possible to reduce the drive voltage while maintaining the driving force to the rotor 100. This is because, when the vibrating plate 10 is vibrated with its natural vibration frequency, the both ends of the vibrating plate 10 are sufficiently greatly displaced by the vibration, and the displacement is not amplified even if a voltage is applied to the displaced portions so as to expand and contract the piezoelectric elements 30 and 31 provided on the both ends.

Figure 22:
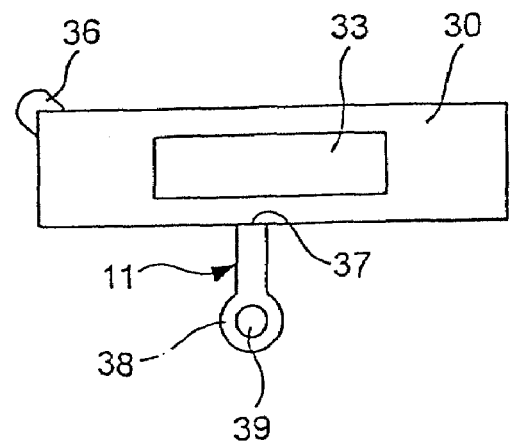
FIG. 22 is a plan view showing another example of the vibrating plate of the second modification of the piezoelectric actuator.

As shown in FIG. 22, the electrodes 33 may be disposed only on the widthwise (vertical direction in the figure)

central part of the piezoelectric elements 30 and 31, and may not be disposed on the widthwise both ends (upper and lower sides in the figure).

A-7-3. Third Modification

While the rectangular vibrating plate 10 is used in the above-described embodiment, a tapered vibrating plate 95 having a small thickness on the side of the rotor 100 may be used. When preparing the vibrating plate 95 having such a shape, tapered piezoelectric elements and reinforcing plate may be stacked in a manner similar to the above-described vibrating plate 10. The use of such a vibrating plate 95 amplifies the displacement of an end 96 of the vibrating plate 95 on the side of the rotor 100, whereby the rotor 100 can be driven at high speed. In addition, since the lengths in the widthwise direction that is the vertical direction of the figure are not uniform, the widthwise resonance of the vibrating plate 95 can be restricted, that is, the vibration in the widthwise direction, can be reduced.

Figure 23:
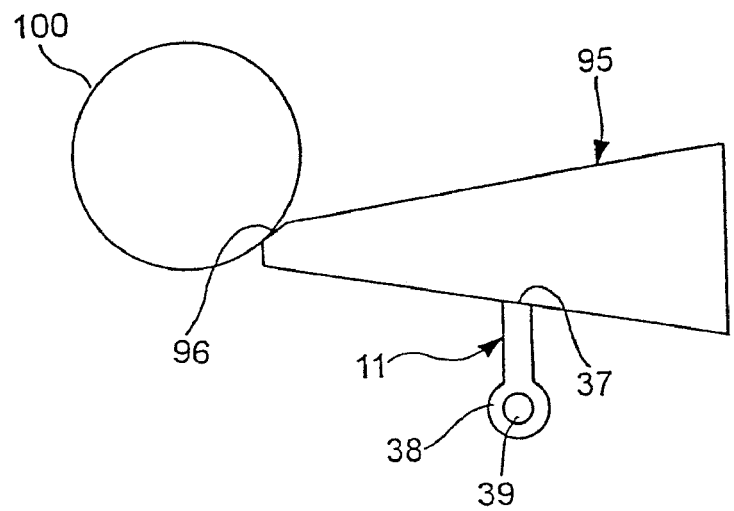
FIG. 23 is a plan view showing a third modification of the piezoelectric actuator.
Figure 24:
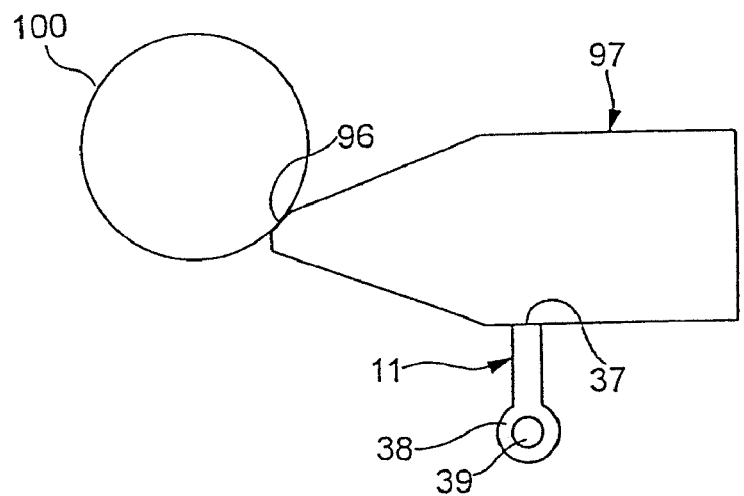
FIG. 24 is a plan view showing another example of a vibrating plate of the third modification of the piezoelectric actuator.

In addition, a vibrating plate 97 having a shape shown in FIG. 24 may be used. As shown in the figure, the vibrating plate 97 is, unlike the totally tapered vibrating plate 95, partially (in the figure, the side of the rotor 100) tapered. The use of the vibrating plate having such a shape makes it possible to drive the rotor 100 at high speed in a manner similar to the vibrating plate 95 shown in FIG. 23, compared with the rectangular vibrating plate 10.

In addition, when a vibrating plate having a shape such that the thickness decreases toward the rotor 100 is used, the rotor 100 can be driven at high speed. For example, a vibrating plate 98 having a shape shown in FIG. 25 may be used.

Figure 25:
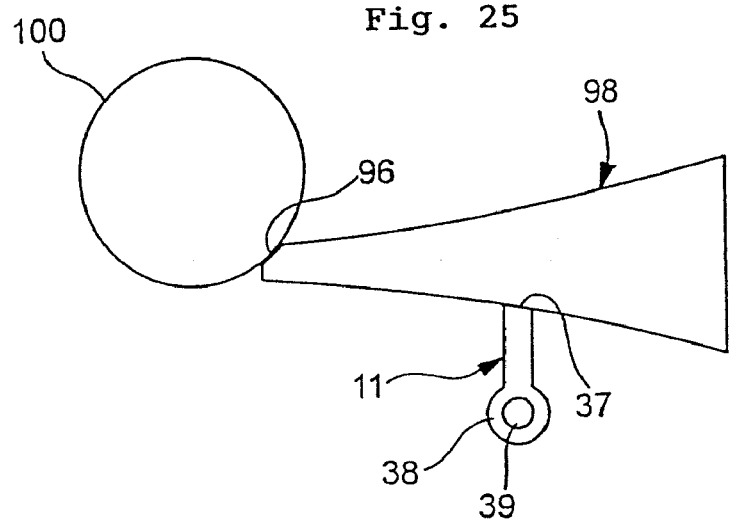
FIG. 25 is a plan view showing still another example of the vibrating plate of the third modification of the piezoelectric actuator.
Figure 26:
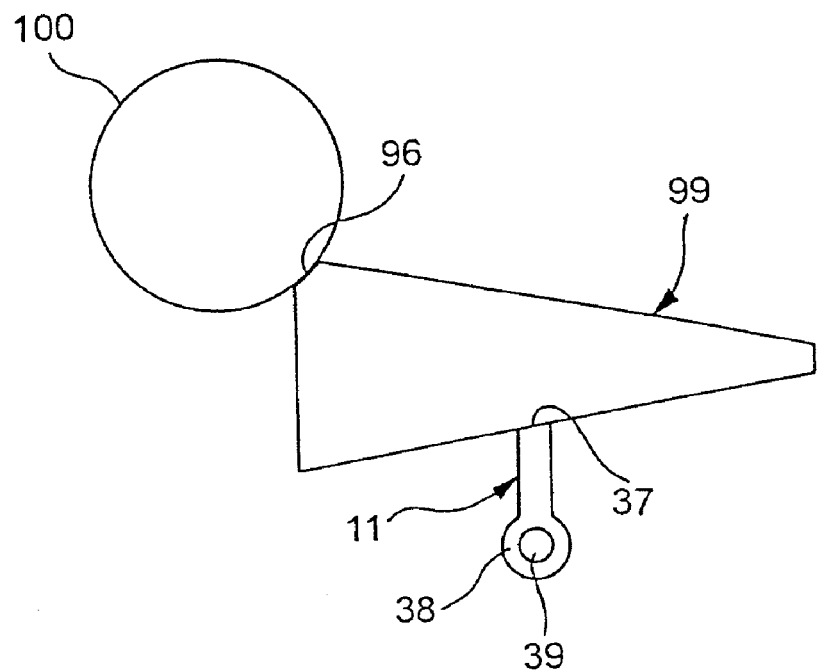
FIG. 26 is a diagram showing a further example of the vibrating plate of the third modification of the piezoelectric actuator.

While the vibrating plates shown in FIGS. 23 to 25 are suitable for driving the rotor 100 at high speed, a vibrating plate 99 having the shape shown in FIG. 26 may be used when the rotor is driven at low speed and high torque. As shown in the figure, the vibrating plate 99 has a shape such that the width increases toward the rotor 100. In the vibrating plate 99, while displacement of an end 96 that is a contacting part between the end 96 and the rotor 100 is reduced, compared with the rectangular vibrating plate 10, torque which tends to rotate the rotor 100 is increased, whereby a low-speed drive with high torque can be effected.

Figure 27:
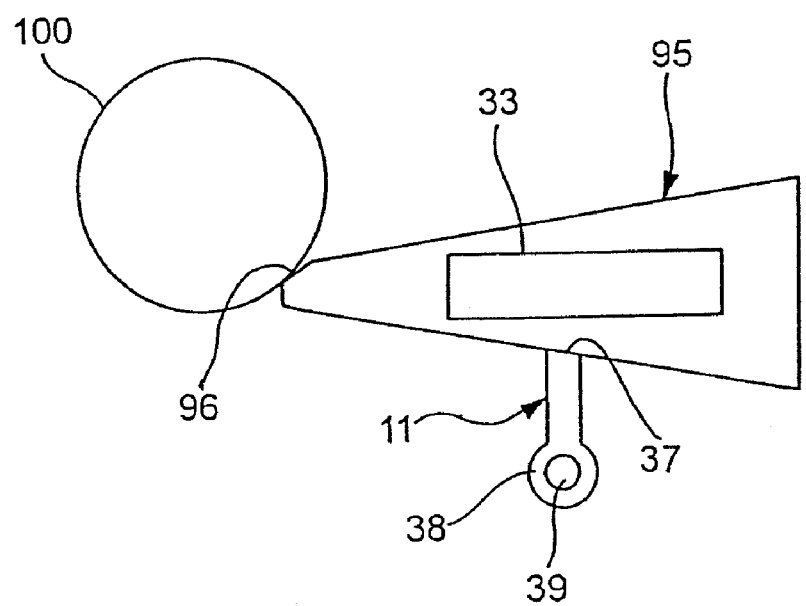
FIG. 27 is a diagram showing a still further example of the vibrating plate of the third modification of the piezoelectric actuator.

When a vibrating plate having a shape other than the rectangular shape shown in FIGS. 23 to 26 is used, the electrodes provided on the upper and lower surfaces thereof may have a rectangular shape. For example, as shown in FIG. 27, when a rectangular electrode is formed on the vibrating plate 95, a high-speed drive with low drive voltage can be effected.

A-7-4. Fourth Modification

Figure 28:
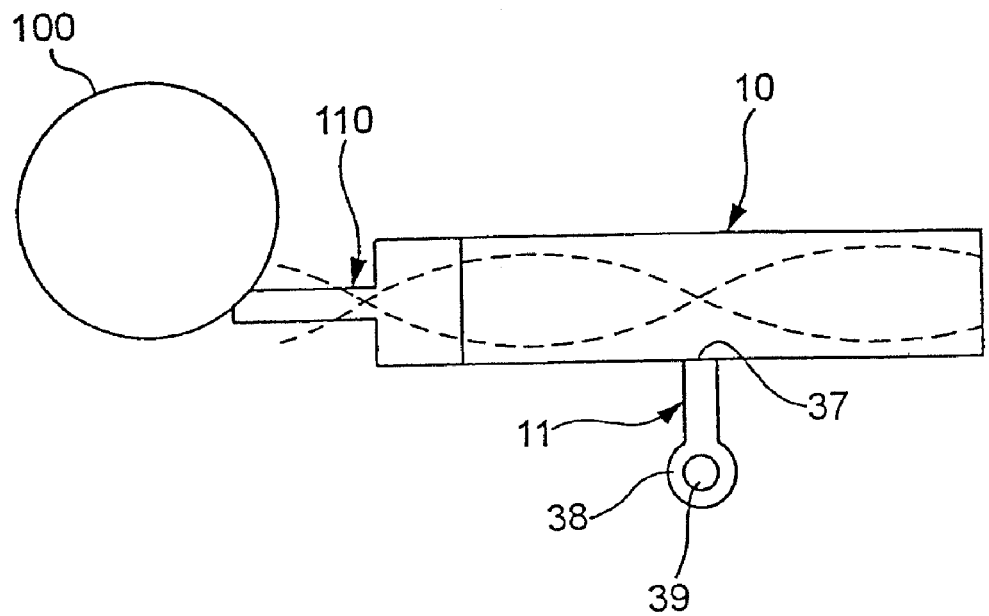
FIG. 28 is a plan view showing a fourth modification of the piezoelectric actuator.
Figure 29:
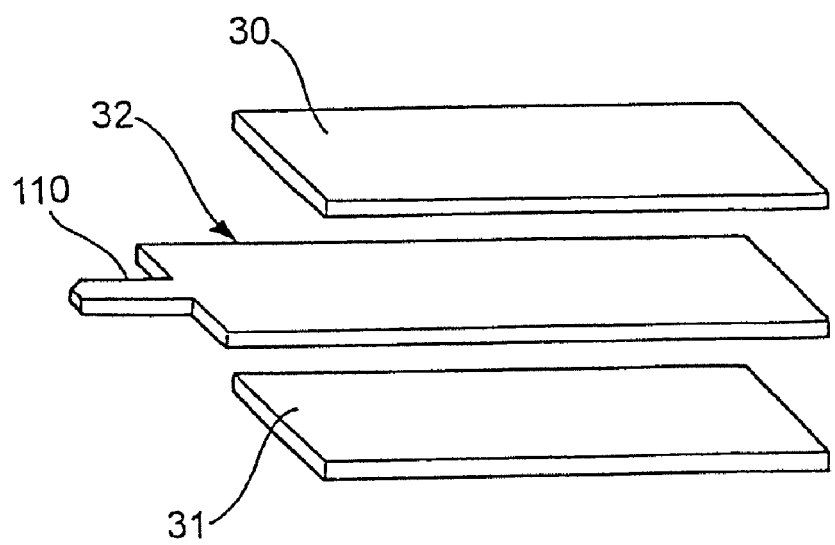
FIG. 29 is a diagram showing a manufacturing method of a vibrating plate of the fourth modification.
Figure 30:
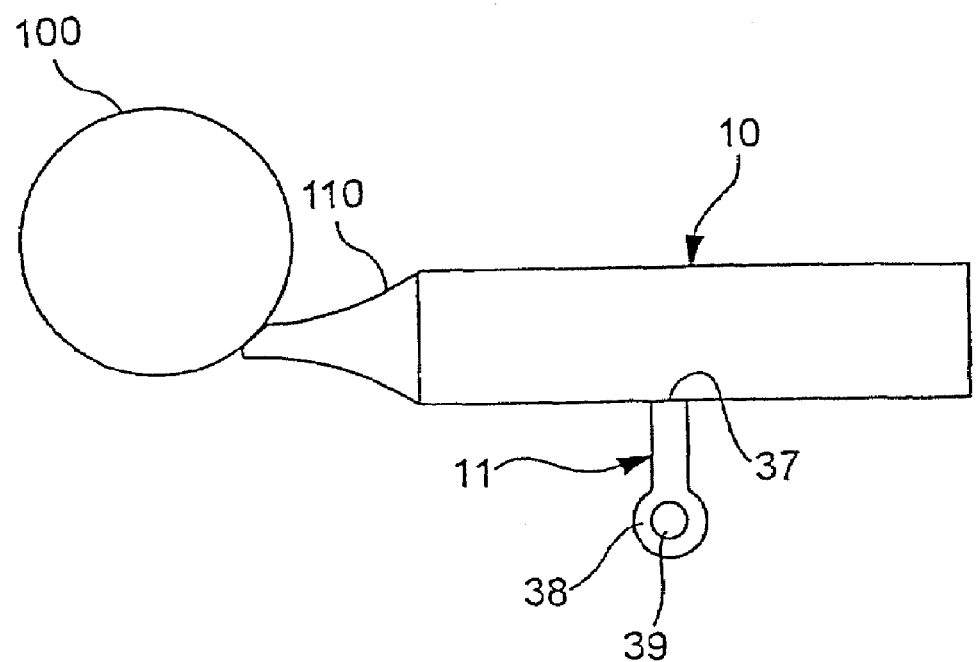
FIG. 30 is a plan view showing another example of the fourth modification of the piezoelectric actuator.

As shown in FIG. 28, a horn part (extended part) 110 extending toward the rotor 100 from the vibrating plate 10 may be provided. When providing such a horn part 110, the reinforcing plate 32 may be prepared in the shape including the horn section 110, as shown in the figure, and the piezoelectric elements 30 and 31 may be stacked on the upper and lower sides of the reinforcing plate 32, respectively. When the vibrating plate 10 is vibrated in this construction, the vibrating plate 10 and the horn part 110 vibrate with amplitude shown by broken lines in FIG. 28. Therefore, the displacement of the tip of the horn part 110 abutting against the rotor 100 is amplified, whereby the driving force can be efficiently provided. The horn part 110 may have a shape shown in FIG. 30.

A-7-5. Fifth Modification

Figure 31:
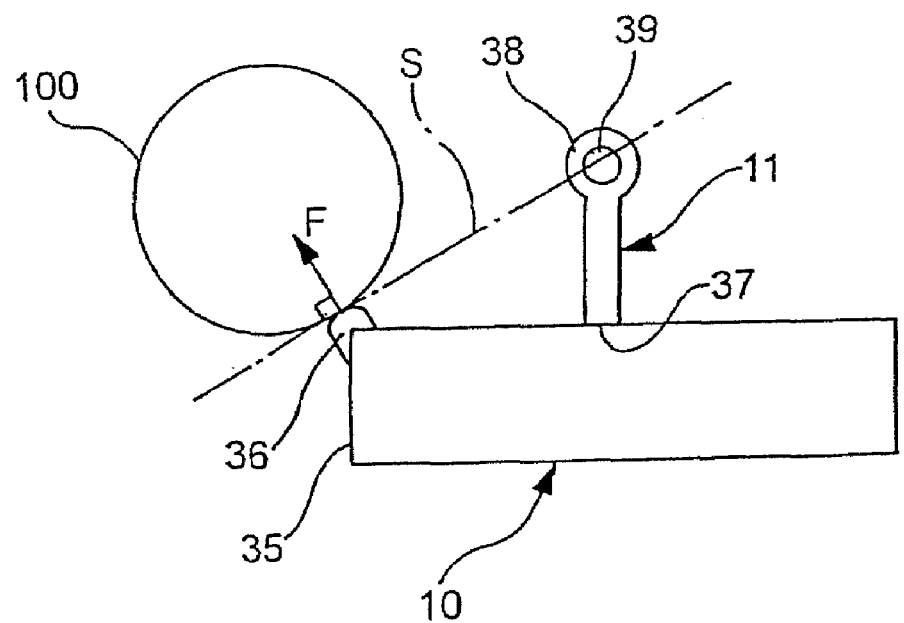
FIG. 31 is a plan view showing a fifth modification of the piezoelectric actuator.

As shown in FIG. 31, the vibrating plate 10, the support member 11 and the rotor 100 may be disposed so that the end 38 of the support member 11 is located on a tangent to the projection 36 of the vibrating plate 10 and the rotor 100, i.e., on the line S perpendicular to the direction of a pressing force F from the projection 36 to the rotor 100 in the initial vibration state. When the vibrating plate 10, the support plate 11, and the rotor 100 are disposed so as to achieve such a positional relationship, the contact position and the angle between the rotor 100 and the projection 36 are not changed even if fine adjustment of the positions of the support member 11 and the vibrating plate 10 is effected around the end 38 secured by the screw 39 in order to adjust the pressing force and the like of the projection 36 to the rotor 100, whereby the driving force can always be stably provided. In addition, variations in the contact angle between the vibrating plate and the rotor due to the shape, the position, the change with the passage of time, and the like can be prevented.

A-7-6. Sixth Modification

Figure 32:
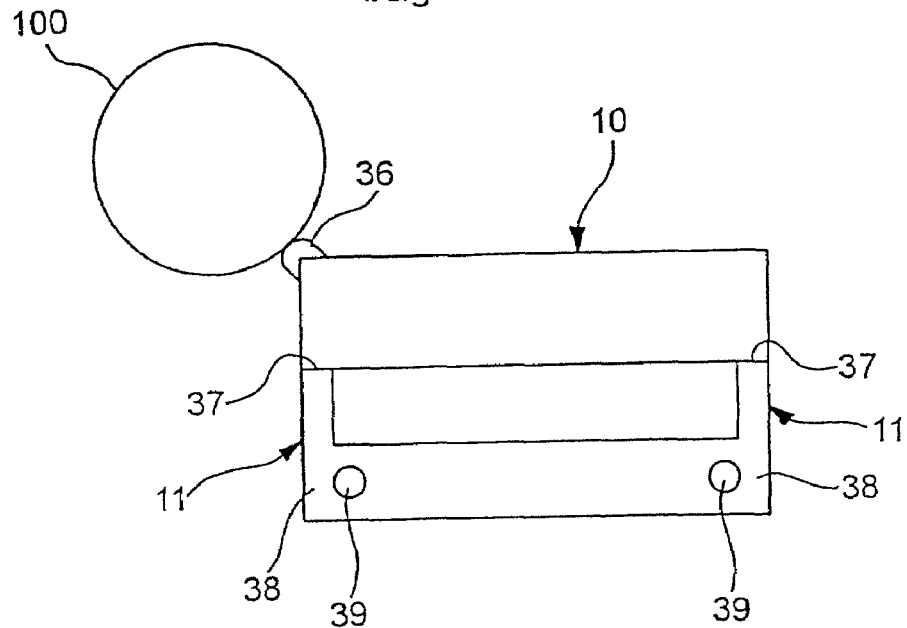
FIG. 32 is a plan view showing a sixth modification of the piezoelectric actuator.
Figure 33:
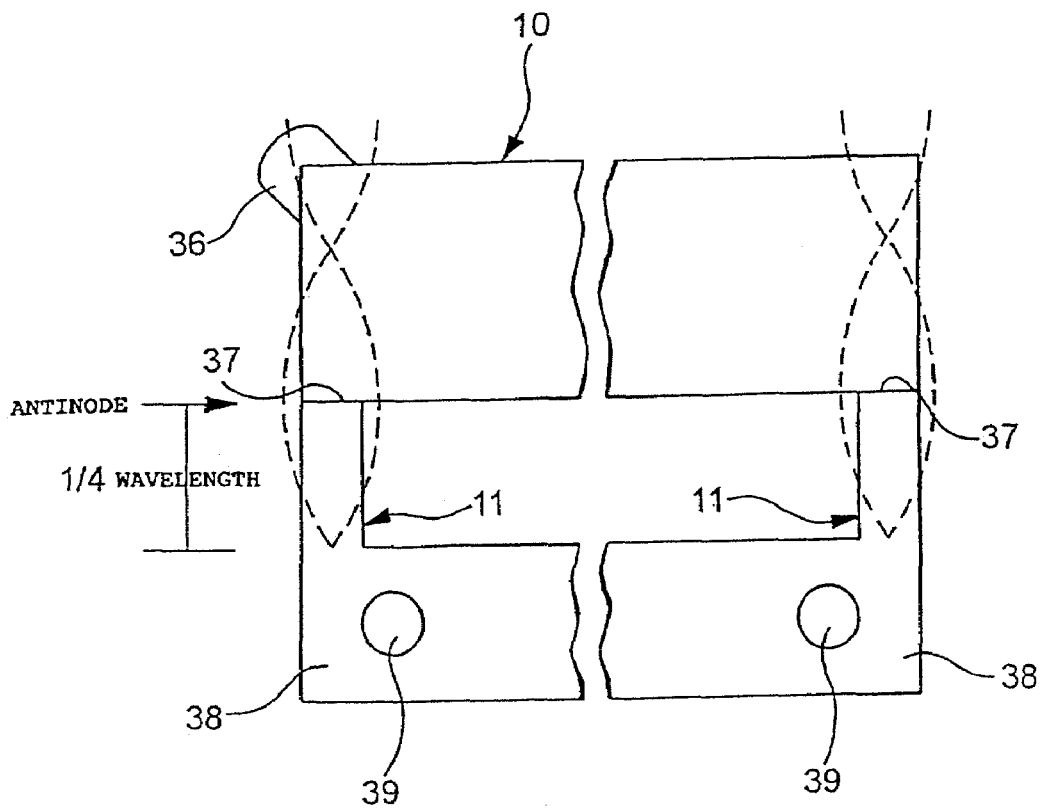
FIG. 33 is a diagram for explaining the amplitude of a support member of the sixth modification of the piezoelectric actuator.

As shown in FIG. 32, the longitudinal both ends of the vibrating plate 10 may be supported by two support members 11. This can restrict the vibration of the vibrating plate 10 in the widthwise direction (vertical direction in the figure), that is, the vibration that prevents the vibration in the horizontal direction in the figure required for driving the rotor 100 can be restricted. In this case, if the end 37 of the support member 11 substantially coincides with the position of an antinode of vibration of the support member 11 in accordance with the vibration of the vibrating plate 10, as shown in FIG. 33, for example, if the length of the support member 11 is set to be a quarter of the vibration wavelength of the support member 11, the prevention of the vibration in the horizontal direction in the figure that is a longitudinal direction of the vibration plate 10 is reduced, whereby efficiency is further improved.

Figure 34:
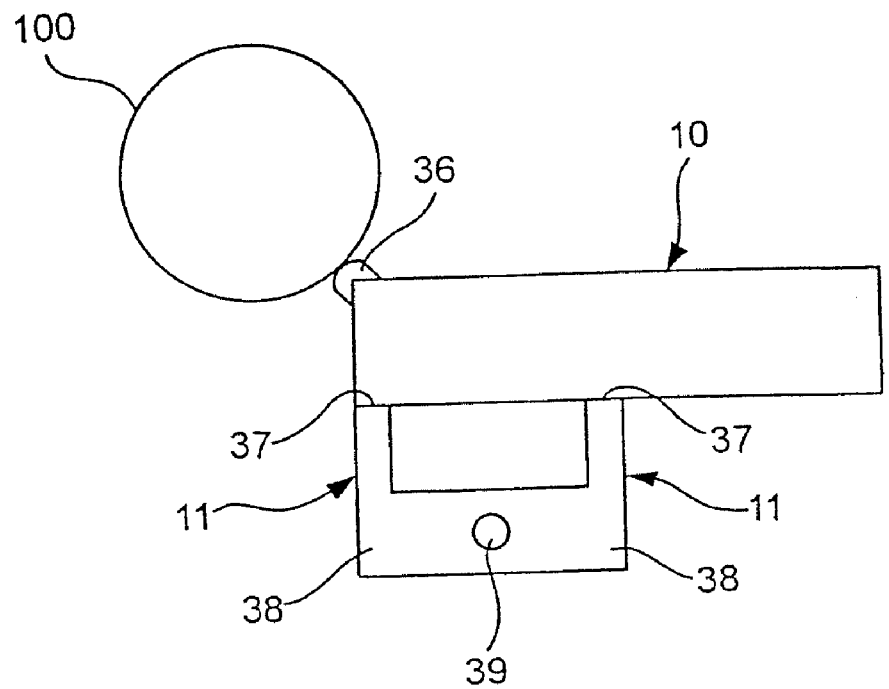
FIG. 34 is a plan view showing another example of the sixth modification of the piezoelectric actuator.

In addition, when supporting the vibrating plate 10 by the two support members 11 as shown in FIG. 34, the position of the node of the vibration of the vibrating plate 10 may be supported by one (the right side in the figure) of the two support members 11, and an end of the vibrating plate 10 on the side of the rotor 100 may be supported by the other one (the left side in the figure) of the support members 11. Since one of the support members 11 supports the node of the vibration, this can reduce the loss of vibration energy, and the other one of the support members 11 can restrict the vibration in the widthwise direction near the contacting part between the support member 11 and the rotor 100.

A-7-7. Seventh Modification

Figure 35:
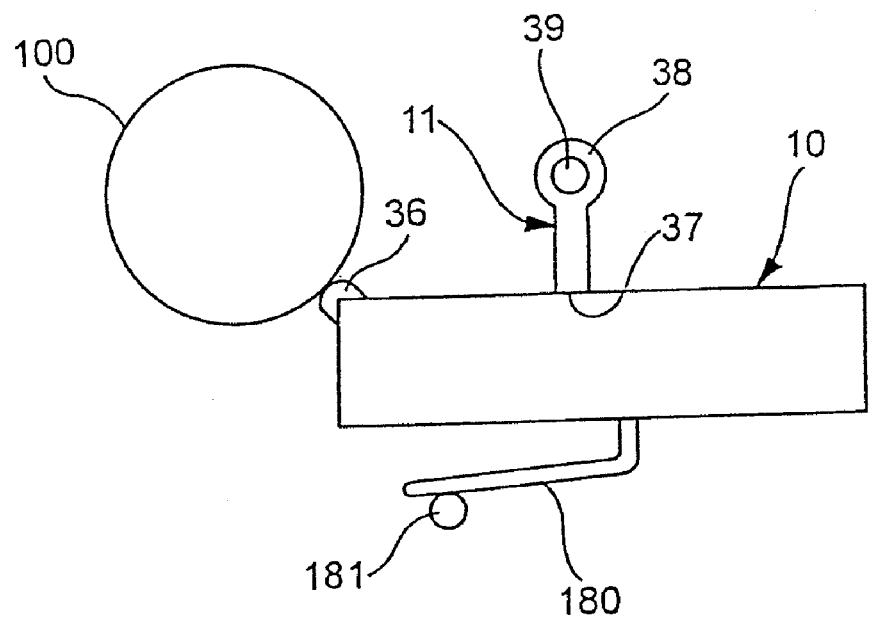
FIG. 35 is a plan view showing a seventh modification of the piezoelectric actuator.

While the support member 11 urges the vibration plate 10 toward the rotor 100 in the above-described embodiment, the vibrating plate 10 may be urged toward the rotor 100 by providing a spring member (elastic member) 180, as shown in FIG. 35. As shown in the figure, the support member 11 is mounted on the upper side of the vibrating plate 10, and one end of the spring member 180 is mounted on the lower side of the vibrating plate 10. The other end of the spring member 180 is supported by a pin 181 provided on the main plate 103 (see FIG. 1). This allows the vibrating plate 10 to be urged toward the rotor 100, upper side in the figure, whereby the projection 36 is brought into abutment with the side surface of the rotor 100. The spring member 180 is provided so as to urge the vibrating plate 10 toward the rotor 100 in this way, the driving force can be stably transmitted in a manner similar to the piezoelectric actuator A1 in the above-described embodiment.

Figure 36:
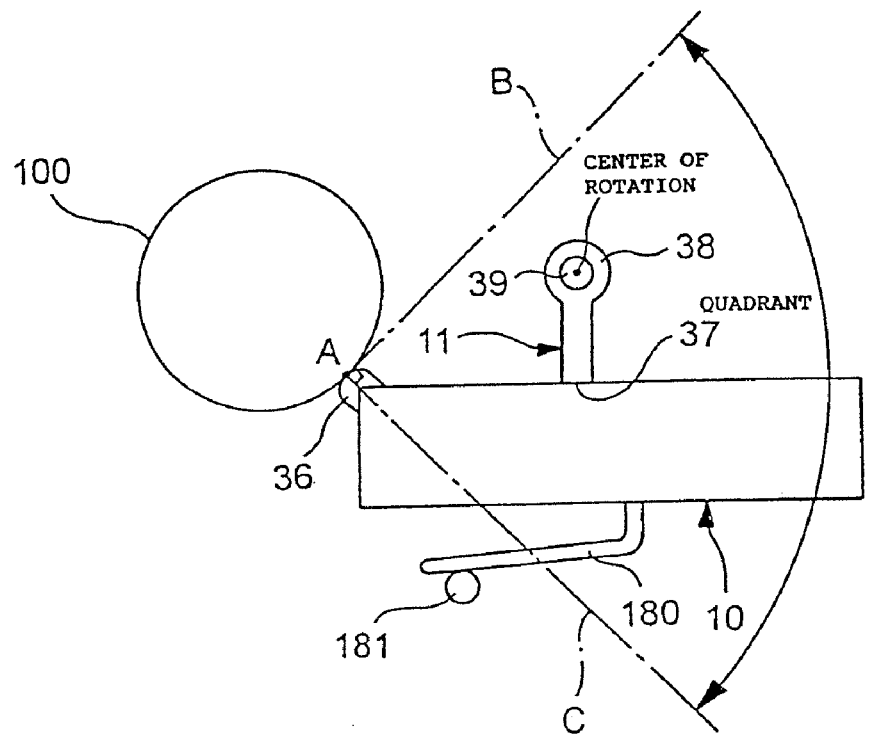
FIG. 36 is a diagram for explaining the position of the center of rotation of a support member for rotationally supporting a vibrating plate of the seventh modification of the piezoelectric actuator.
Figure 37:
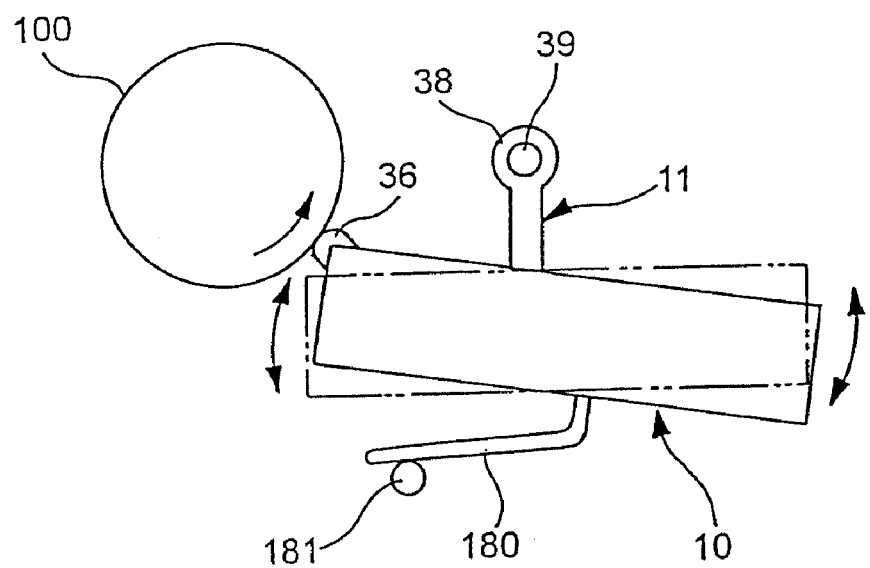
FIG. 37 is a diagram for explaining the operation of the vibrating plate when the rotor is to be rotated in the reverse direction in the seventh modification.

When the support member 11 for supporting the vibrating plate 10 and the spring member 180 for urging the vibrating plate 10 toward the rotor 100 are provided in this way, the vibrating plate 10 may also be provided so as to be rotated around the position (for example, the position of the end 38 as shown in the figure) within a quadrant formed by the line B and the line C, as shown in FIG. 36, in a manner similar to the above-described embodiment. Even if the rotor 100 tends to be rotated in the opposite direction due to the external force, this construction allows the vibrating plate 10 to return to the former position after it is rotated in accordance with the rotation of the rotor 100 in the opposite direction, and the rotor 100 returns to a normal direction in accordance with the return of the vibrating plate 10, as shown in FIG. 37, whereby the rotation of the rotor 100 in the opposite direction can be restricted.

Figure 38:
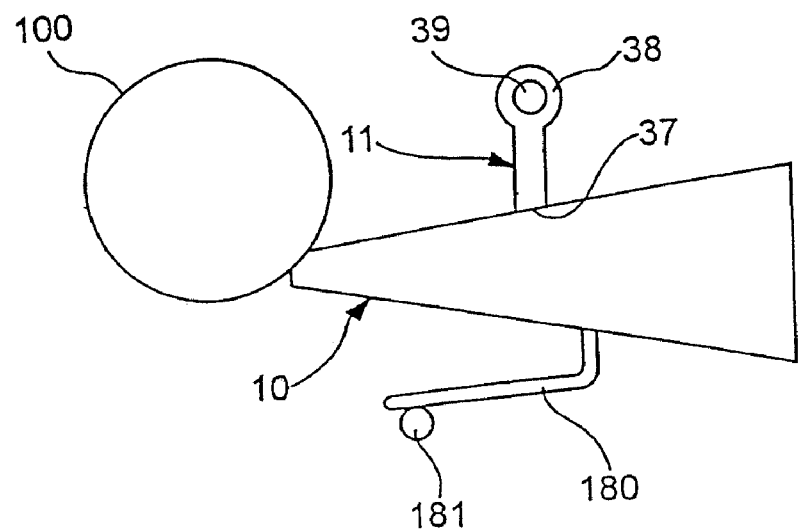
FIG. 38 is a plan view showing another example of the seventh modification of the piezoelectric actuator.

Incidentally, when the support member 11 and the spring member 180 are provided in this way, the vibrating plate 10 may also be formed in a tapered shape, as shown in FIG. 38, and the horn part (see FIG. 28) may be provided.

Figure 39:
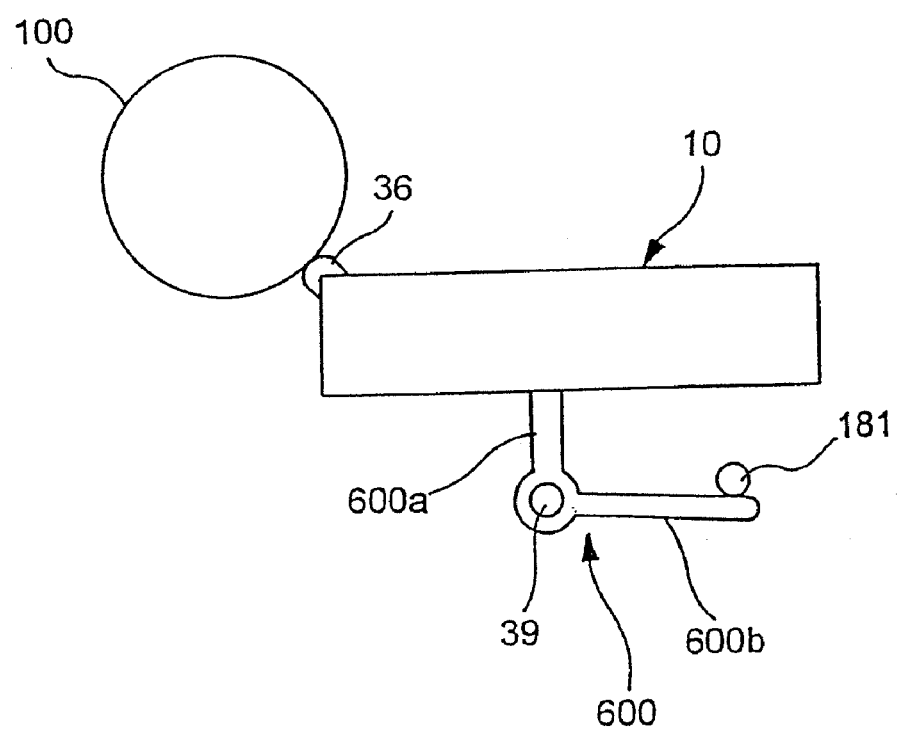
FIG. 39 is a plan view showing a further modification of the seventh modification of the piezoelectric actuator.

As shown in FIG. 39, an elastic support member 600 that is a combination of a support member for supporting the vibrating plate 10 and a spring member for urging the vibrating plate 10 toward the rotor 100 may be provided. As shown in the figure, the elastic support member 600 is an L-shaped member, and has a support portion 600a for supporting the vibrating plate 10 and a spring portion 600b extending from the support portion 600a while being bent thereat. The elastic support member 600 is supported by a screw 39 at a portion that is an intermediate part between the support portion 600a and the spring portion 600b, and an end of the spring portion 600b is supported by the pin 181, whereby the vibrating plate 10 is urged toward the rotor 100. This brings the projection 36 into abutment with the outer peripheral surface of the rotor 100. In addition, slight rotation of the elastic support member 600 around the screw 39 is allowed, whereby the rotation of the rotor 100 in the opposite direction can be restricted in a manner similar to the piezoelectric actuator A1.

A-7-8. Eighth Modification

While the vibrating plate has a structure in which the piezoelectric elements 30 and 31 are stacked on the upper and lower sides of the reinforcing plate 32 in the above-described embodiment, the vibrating plate may have a simple structure in which one piezoelectric element is stacked on a reinforcing plate. In addition, three or more piezoelectric elements may be stacked.

A-8. Conductive Construction to Piezoelectric Actuator

Next, a description will be given of a conductive construction for supplying a drive voltage from the driving circuit 500 to the piezoelectric elements in the piezoelectric actuators of the above-described various modifications. Power can be usually supplied to the piezoelectric elements by wiring the electrodes 33 provided on the vibrating plate 10 from the driving circuit 500. For the purpose of simplifying the conductive construction, however, power may be supplied to the piezoelectric elements by various conductive constructions, as shown in FIGS. 40 to 45.

Figure 40:
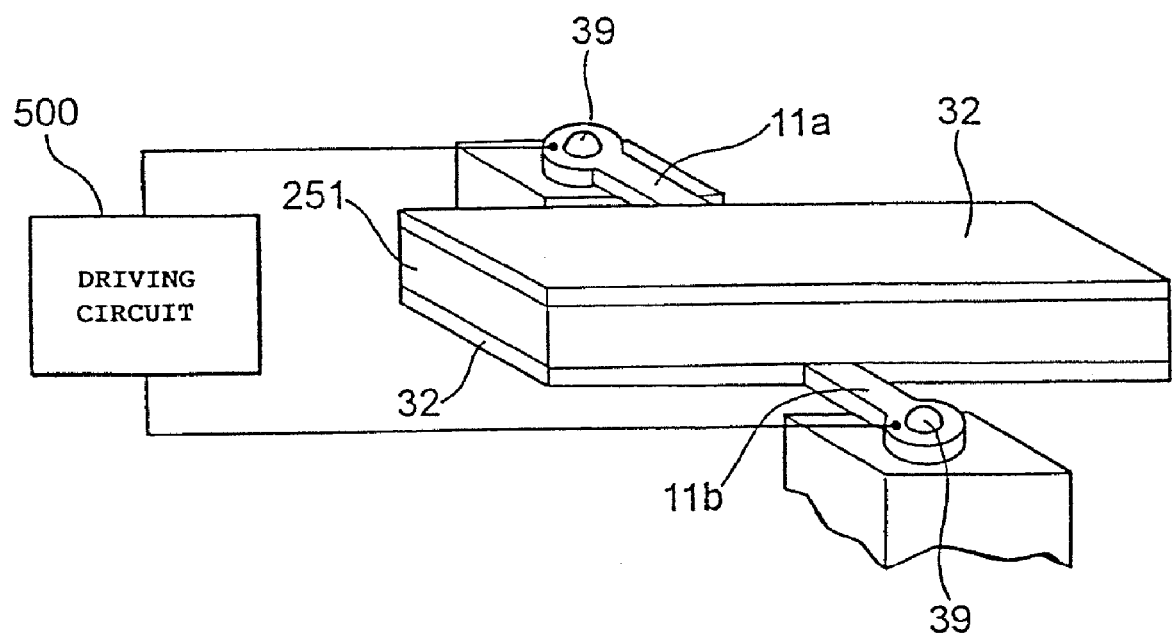
FIG. 40 is a diagram showing a conductive construction for supplying a drive voltage to the piezoelectric actuator.

While the vibrating plate 10 has a structure in which the piezoelectric elements 30 and 31 are stacked on the upper and lower sides of the reinforcing plate 32 in the above-described piezoelectric actuator A1, a piezoelectric actuator shown in FIG. 40 has a structure in which reinforcing plates 32 are stacked on the upper and lower sides of one piezoelectric element 251. The reinforcing plate 32 of the upper layer is supported by a support member 11a, the reinforcing plate 32 of the lower layer is supported by a support member 11b, and the reinforcing plates 32, the support members 11a and 11b are formed of conductive materials. In this construction, the drive voltage from the driving circuit 500 is supplied to the piezoelectric element 251 via the support members 11a and 11b and the reinforcing plates 32. This allows the support members 11a and 11b to serve the conducting function of supplying the drive voltage to the piezoelectric element 251, in addition to the function of supporting the vibrating plate 10 while urging toward the rotor 100. Therefore, the need to separately provide a conductive construction, such as wiring, for supplying the drive voltage to the piezoelectric element 251 is eliminated, whereby the construction is simplified. In addition, when another conductive component is provided, the conductive component may prevent the vibration of the vibrating plate 10. This conductive construction, however, does not encounter such a problem, and the driving force can be efficiently transmitted.

Figure 41:
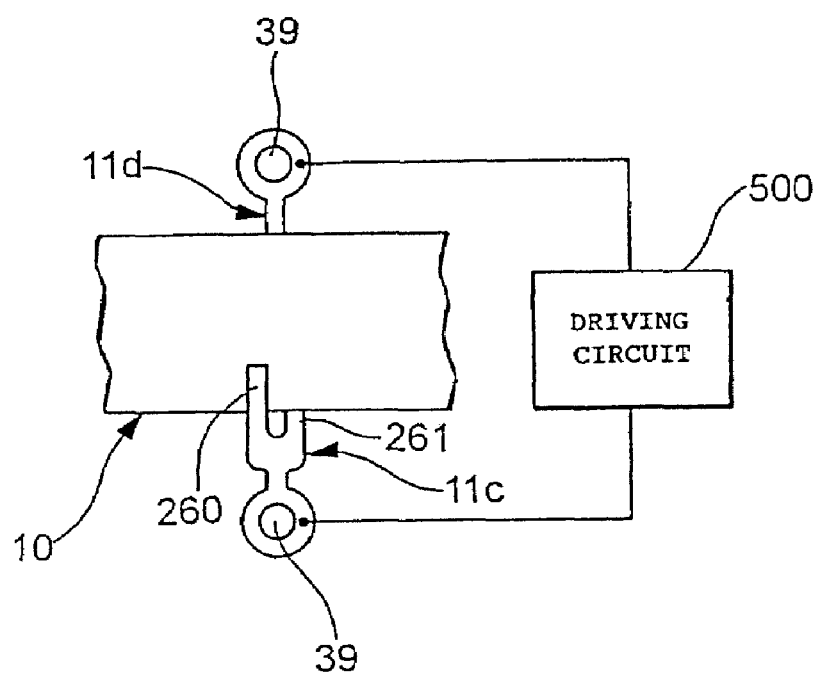
FIG. 41 is a diagram showing a modification of the conductive construction for supplying the drive voltage to the piezoelectric actuator.
Figure 42:
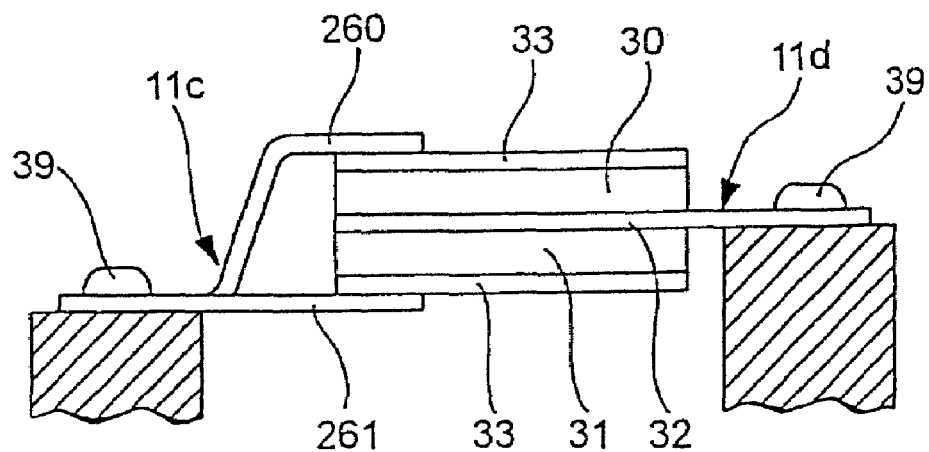
FIG. 42 is a side view showing a modification the conductive construction.

In addition, as shown in FIGS. 41 and 42, when a vibrating plate 10 in which piezoelectric elements 30 and 31 are stacked on the upper and lower sides of a reinforcing plate 32 is used, the drive voltage may be supplied from the driving circuit 500 to the piezoelectric elements 30 and 31 via support members 11c and 11d formed of a conductive material.

As shown in FIGS. 41 and 42, the support member 11c is formed in the shape to branch into two on the side of the vibrating plate 10, and has an upper end 260 branched to the upper side (near side of the plane of FIG. 41) and a lower end 261 branched to the lower side (far side of the plane of the figure). The upper end 260 is attached by solder or a conductive bonding agent to an electrode 33 formed on the surface of the piezoelectric element 30, and the lower end 261 is attached by solder or a conductive to an electrode 33 formed on the surface of the piezoelectric element 31. On the other hand, the support member 11d is attached to the reinforcing plate 32, whereby the drive voltage is supplied from the driving circuit 500 to the piezoelectric elements 30 and 31. In this case, the support members 11c and 11d also serve the function of supporting the vibrating plate 10 and serve the conducting function to the piezoelectric elements 30 and 31, as described above, whereby the construction is simplified, and the driving force can be efficiently transmitted.

Figure 43:
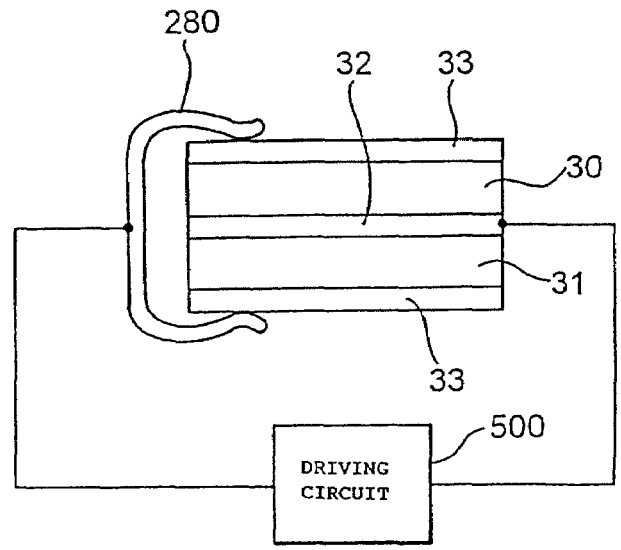
FIG. 43 is a diagram showing another modification of the conductive construction for supplying the drive voltage to the piezoelectric actuator.

While the drive voltage may be supplied from the driving circuit to the piezoelectric elements via the support members formed of the conductive material as described above, the drive voltage may be supplied to the piezoelectric elements by a conductive construction shown in FIG. 43. As shown in the figure, in the conductive construction, the upper and lower surfaces (electrodes 33) of the vibrating plate 10 are clamped by a C-shaped elastic conductive member 280, and wiring is connected from the reinforcing plate 32 to the driving circuit 500. If such an elastic conductive member 280 is used, the drive voltage can be supplied from the driving circuit 500 to the piezoelectric elements 30 and 31 that are stacked on the upper and lower sides even with a simple construction.

Figure 44:
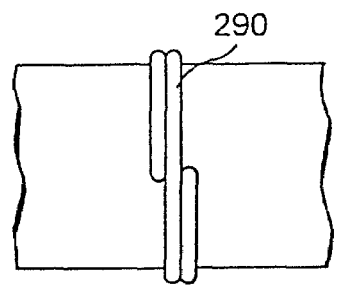
FIG. 44 is a diagram showing a further modification of the conductive construction for supplying the drive voltage to the piezoelectric actuator.
Figure 45:
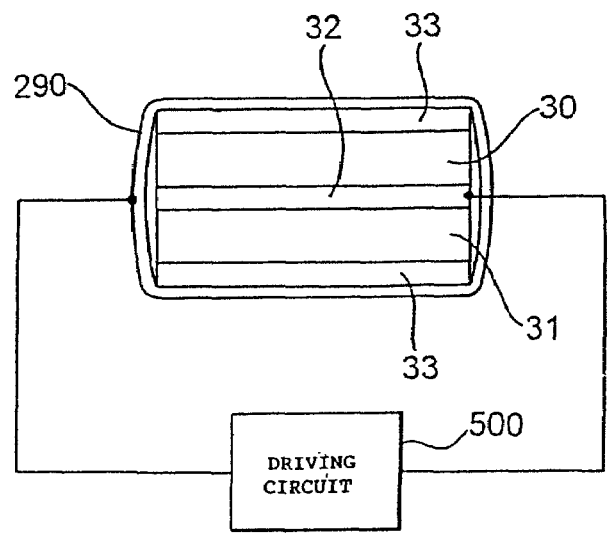
FIG. 45 is a side view showing a still further modification of the conductive construction.

As shown in FIGS. 44 and 45, a wire 290 may be wound around the vibrating plate 10 so that the drive voltage is supplied to the piezoelectric elements 30 and 31 via the wound wire 290. This can also supply the drive voltage to the piezoelectric elements 30 and 31 with a simple conductive construction. When the voltage is supplied via the elastic conductive member 280 or the wire 290 as described above, the stacked structure of the vibrating plate 10 may be either a structure in which electrodes are arranged on upper and lower surfaces or a structure in which the reinforcing plates formed of conductors are formed on the upper and lower surfaces. In addition to the vibrating plate having the stacked structure of the piezoelectric elements and the reinforcing plates, the above-described elastic conductive member 280 or the wire 290 can be used when the voltage is supplied to the piezoelectric elements.

B. Second Embodiment

Next, a description will be given of a piezoelectric actuator according to the second embodiment of the present invention. In the second embodiment, components common to those of the first embodiment are indicated by the same reference numerals, and a description thereof will be omitted.

Figure 46:
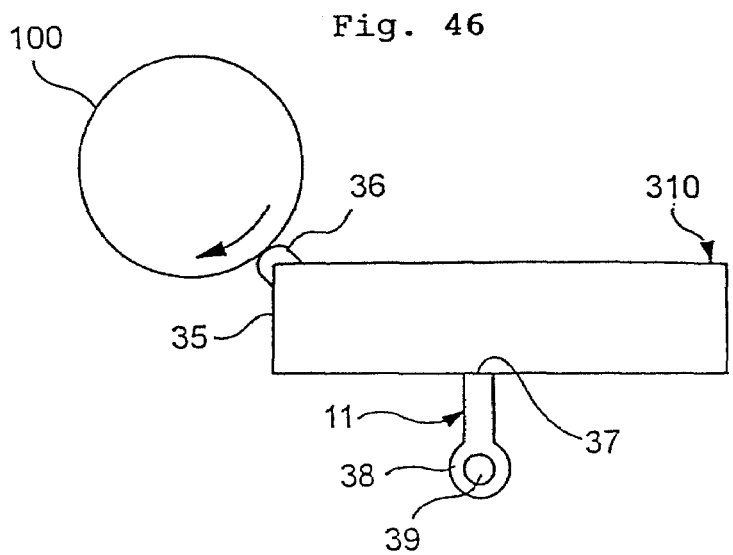
FIG. 46 is a plan view showing the overall construction of a piezoelectric actuator according to a second embodiment of the present invention.

As shown in FIG. 46, the piezoelectric actuator according to the second embodiment includes a vibrating plate 310 in place of the vibrating plate 10 of the piezoelectric actuator A1 according to the first embodiment.

Figure 47:
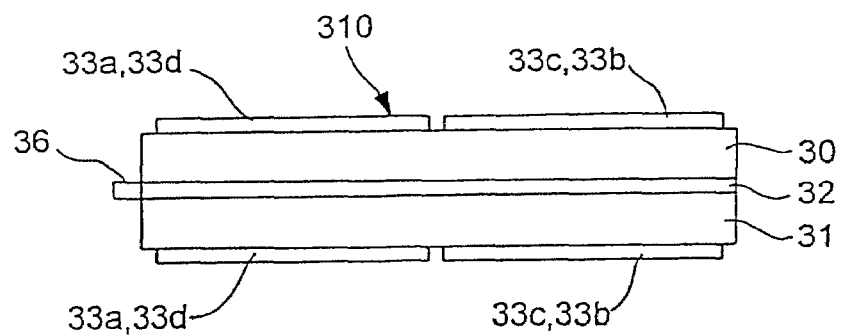
FIG. 47 is a side view showing a vibrating plate that is a component of the piezoelectric actuator according to the second embodiment.
Figure 48:
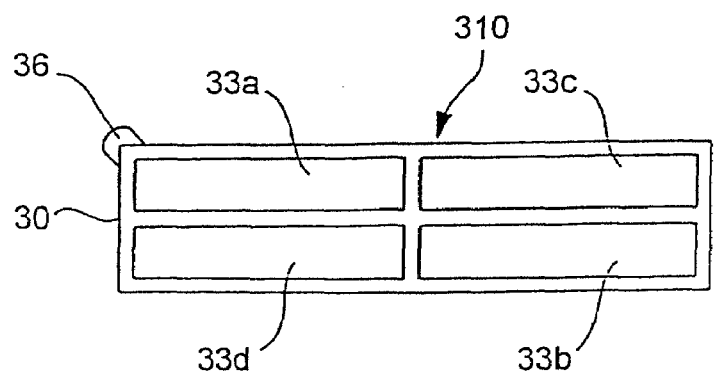
FIG. 48 is a plan view showing the vibrating plate of the piezoelectric actuator according to the second embodiment.

As shown in FIG. 47, the vibrating plate 310 has a structure in which piezoelectric elements 30 and 31 are stacked on upper and lower sides of a reinforcing plate 32 in a manner similar to the vibrating plate 10 in the first embodiment. However, as shown in FIG. 48, the vibrating plate 310 differs from the vibrating plate 10 in that electrodes 33a, 33b, 33c, and 33d are arranged on the piezoelectric elements 30 and 31. In addition, in the vibrating plate 310, the piezoelectric element 30 (also the piezoelectric element 31 although it is not shown in FIG. 4) is divided into four regions, and the electrodes 33a, 33b, 33c, and 33d are arranged on the divided regions, respectively.

A description will be given of a conductive construction for supplying the drive voltage to the electrodes 33a, 33b, 33c, and 33d arranged on the four regions of the piezoelectric element 30 with reference to FIG. 49. As shown in the figure, by switching ON/OFF of a switch (selection unit) 341, a mode for supplying the drive voltage from a power source 340 to all of the electrodes 33a, 33b, 33c, and 33d, and a mode for supplying the drive voltage from the power source 340 to the electrodes 33a and 33d can be switched.

When the switch 341 is turned on, and the mode for supplying the drive voltage to all of the electrodes 33a, 33b, 33c, and 33d is selected, the vibrating plate 310 expands and contacts in the longitudinal direction to cause a longitudinal vibration in a manner similar to the above-described first embodiment (hereinafter, referred to as a longitudinal vibration mode), as shown in FIG. 50(a). On the other hand, when the switch 341 is turned off, and the mode for supplying the drive voltage only to the electrodes 33a and 33d is selected, the piezoelectric elements 33a and 33d only in the regions to which the drive voltage is applied expand and contract, and the vibrating plate 310 causes a bending vibration in the widthwise direction (vertical direction in the figure) within a plane to which the vibrating plate 310 belongs (hereinafter, referred to as a bending vibration mode), as shown in FIG. 50(b). By switching the switch 341 in this way, the vibration mode of the vibration plate 310 can be selected.

Figure 51:
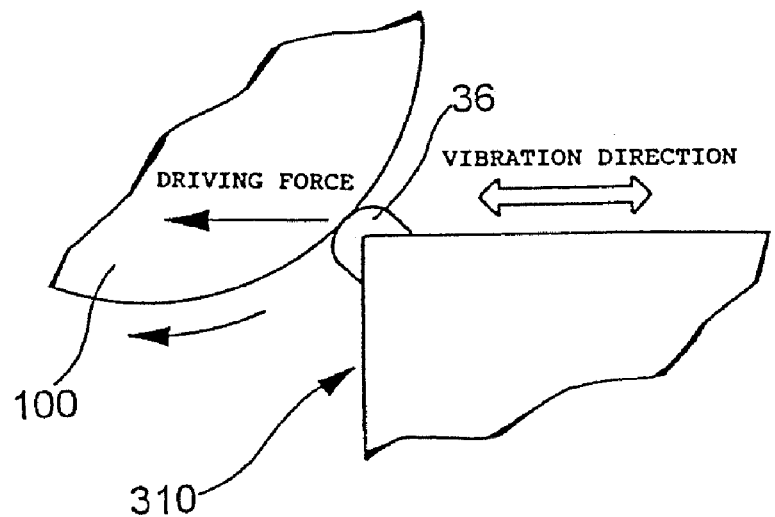
FIG. 51 is a diagram for explaining a driving direction of a rotor when the vibrating plate of the piezoelectric actuator according to the second embodiment causes a longitudinal vibration.

In the piezoelectric actuator according to the second embodiment, the rotor 100 is driven using the vibrating plate 310 that can switch the two vibration modes as described above, and the driving direction of the rotor 100 can be switched by operating the switch 341 to switch the vibration modes. When the longitudinal vibration mode is selected, a leftward driving force in the figure is provided by the longitudinal vibration of the vibrating plate 310 from the abutting part between the rotor 100 and the projection 36, as shown in FIG. 51, whereby the rotor 100 is rotated in a clockwise direction in the figure.

Figure 52:
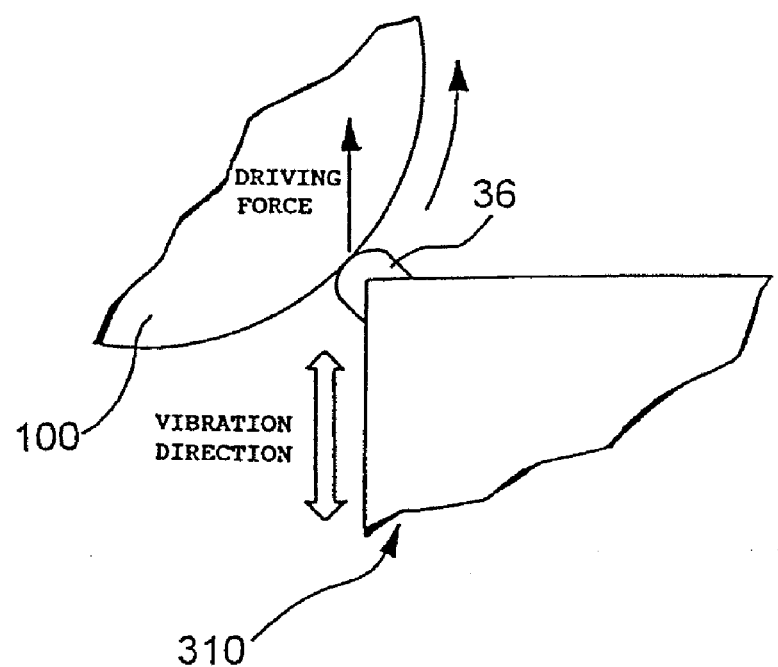
FIG. 52 is a diagram for explaining a driving direction of the rotor when the vibrating plate of the piezoelectric actuator according to the second embodiment causes a bending vibration.

On the other hand, when the bending vibration mode is selected, an upward driving force in the figure is provided by the bending vibration of the vibrating plate 310 from the abutting part between the rotor 100 and the projection 36, as shown in FIG. 52, whereby the rotor 100 is rotated in a counterclockwise direction in the figure.

In the piezoelectric actuator according to the second embodiment, the rotor 100 can be driven in a normal direction and an opposite direction by switching the switch 341. Since the driving direction is switched by switching the vibration modes of the vibrating plate 310 as described above, there is no need to provide a vibrating plate for each driving direction, and to provide an adjustment mechanism for adjusting the positional relationship between the vibrating plate and the rotor that is an object to be driven. Therefore, the driving direction can be switched between the normal direction and the opposite direction without complicating the construction and increasing the size of the device.

In the piezoelectric actuator according to the second embodiment, various modifications can be made in a manner similar to the above-described first embodiment. For example, a cutout may be provided in the vibrating plate 310 in place of the projection 36 (see FIG. 20). In addition, the end 38 of the support member 11 may be located on a tangent to the projection 36 of the vibrating plate 310 and the rotor 100 so that the contact state between the projection 36 and the rotor 100 is stabilized (see FIG. 31). Furthermore, a spring member may be provided in addition to the support member 11 so that the vibrating plate 310 is urged toward the rotor 100 by the spring member (see FIG. 35).

C. Third Embodiment

Next, a description will be given of a piezoelectric actuator according to the third embodiment of the present invention. In the third embodiment, components common to those of the first and second embodiments are indicated by the same reference numerals, and a description thereof will be omitted.

Figure 53:
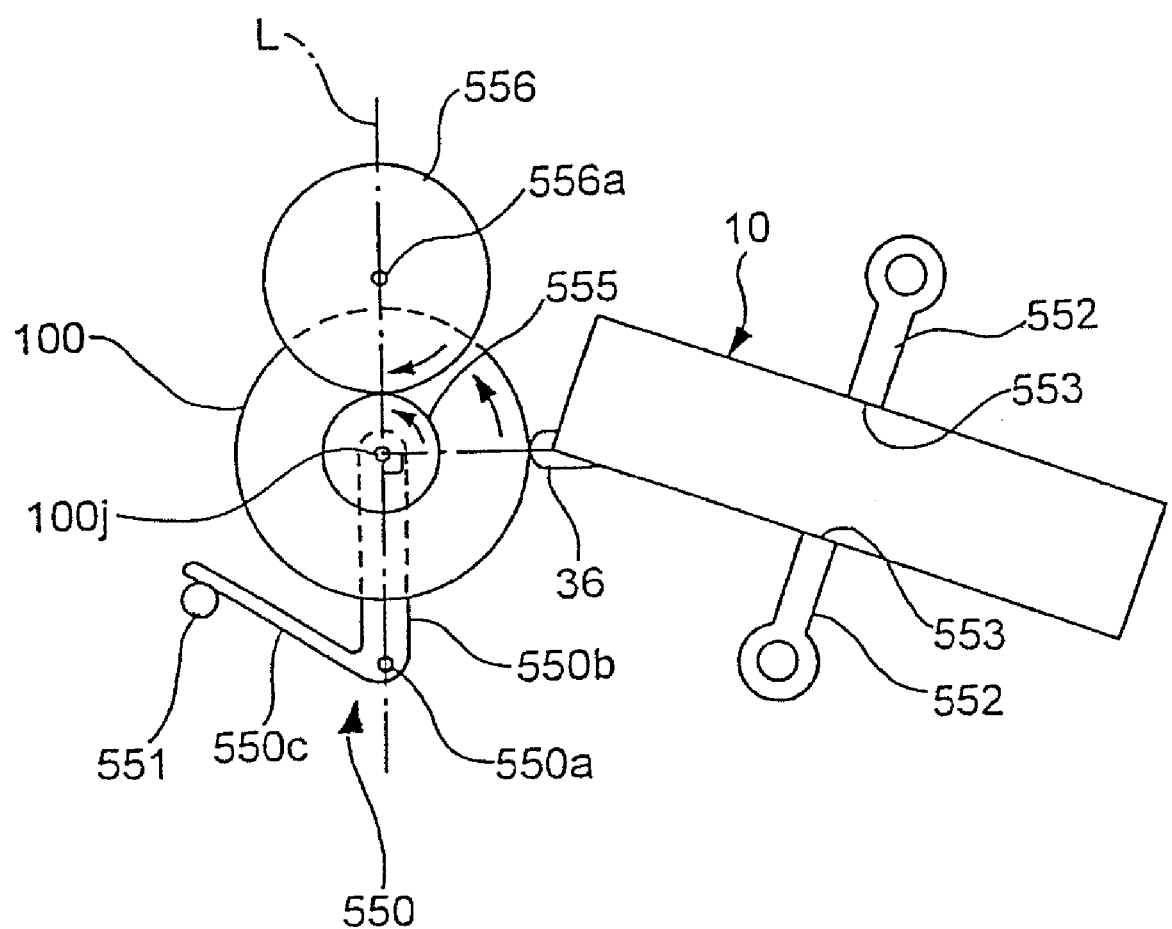
FIG. 53 is a plan view showing the overall construction of a piezoelectric actuator according to a third embodiment of the present invention.

While the vibrating plate is urged toward the rotor 100 by an urging force of the spring member or the support member in the above-described first and second embodiments, the rotor 100 is urged toward the vibrating plate in the third embodiment. A description will be given of this construction with reference to FIG. 53. As shown in the figure, in this embodiment, a rotating shaft 100j of the rotor 100 is supported on one end of an elastic rotating member 550, and the rotating shaft 100j is rotatable around a rotating shaft 550a of the elastic rotating member 550. The elastic rotating member 550 is composed of a rotating portion 550b of which one end supports the rotating shaft 100j and the other end is rotationally supported around the rotating shaft 550a, and a spring portion 550c extending from the side of the rotating shaft 550a of the rotating portion 550b while being bent thereat. The side surface of the spring portion 550c is supported by a raised pin 551, whereby the rotating portion 550b is urged to rotate in a clockwise direction in the figure. That is, the rotating shaft 100j of the rotor 100 is urged rightward in the figure.

On the other hand, the vibrating plate 10 is, unlike the first embodiment, supported by support members 552 formed of a rigid body at widthwise both ends thereof. The support members 552 support the vibrating plate 10 at the position of a node of vibration when the vibrating plate 10 vibrates, and the position of the vibrating plate 10 and mounting portions 553 of the support members 552 are fixed. By fixing the vibrating plate at the position of the node of vibration, the vibration of the vibrating plate 10 can be stabilized. Even if the vibrating plate 10 is fixedly supported, since the rotor 100 is urged toward the vibrating plate 10, sufficient friction is produced between the outer peripheral surface of the rotor 100 and the projection 36, whereby the driving force can be transmitted therebetween with higher efficiency.

When the piezoelectric actuator has a gear mechanism and the like for increasing or decreasing a speed, such as a first gear 555 that is coaxial with the rotor 100, i.e., rotated together with the rotor 100 using the rotating shaft 100j as a rotating shaft, and a second gear 556 meshed with the first gear 555, it is preferable that components be arranged so that the rotating shaft 550a of the elastic rotating member 550, the rotating shaft 100j, and a rotating shaft 556a of the second gear 556 are arranged substantially on the straight line L, as shown in the figure, and that the vibrating plate 10 is arranged so that the projection 36 is located in the direction perpendicular to the line L from the rotating shaft 100j of the rotor 100. This is because, by arranging the components in this way, even if the elastic rotating member 550 is rotated due to variations during mounting, variations in size, and the wear of the contact part, the contact angle between the rotor 100 and the projection 36 does not change very much, whereby a good contact state can be maintained. In addition, when the first gear 555 is rotated, the positional relationship between the first gear 555 and the second gear 556 does not change very much, whereby the driving force can be stably transmitted.

In the above-described construction, when a load applied to the second gear 556 is increased, that is, when a force which tends to rotate the second gear 556 in a direction opposite to a driving direction that is a counterclockwise direction in the figure is increased, a force which tends to rotate the first gear 555 and the rotor 100 in a clockwise direction is also increased. That is, a force received by the first gear 555 on the right side in the figure at a meshed portion with the second gear 556 is increased. In accordance with the increase, a force which tends to rotate the elastic rotating member 550 for supporting the rotating shaft 100j in a clockwise direction in the figure is increased, whereby the force of the outer peripheral surface of the rotor 100 pressing against the projection 36 is increased. When the force of the outer peripheral surface of the rotor 100 pressing against the projection 36 is increased in this way, the friction between the rotor 100 and the projection 36 is increased, and a torque that can be transmitted from the vibrating plate 10 to the rotor 100 is increased. In this way, in this piezoelectric actuator, the torque can be increased as the load increases. Conversely, when the load is decreased, the friction between the outer peripheral surface of the rotor 100 and the projection 36 is decreased, but the decrease in the friction makes it possible to drive the rotor 100 with a low power. Therefore, in the piezoelectric actuator according to the third embodiment, the maximum torque can be improved although it can be operated with a low power consumption during the low-loaded state.

Figure 54:
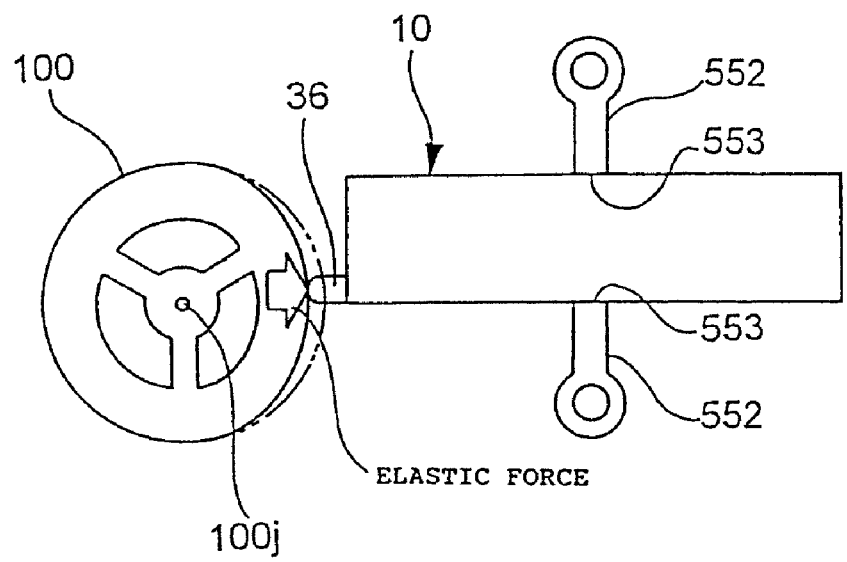
FIG. 54 is a plan view showing a modification of the piezoelectric actuator according to the third embodiment.

While the rotating shaft 100j of the rotor 100 is movable, and the elastic rotating member 550 urges the rotor 100 toward the vibrating plate 100 in the third embodiment, the rotor 100 may be formed of an elastic body so that the outer peripheral surface of the rotor 100 is pressed toward the vibrating plate 10 by an elastic force of the rotor 100, as shown in FIG. 54. In this case, if the position of the rotating shaft 100j of the rotor 100 is fixed to a position such that the rotor 100 that does not receive the external force, that is, the rotor 100 that is not elastically deformed, is arranged where the outer peripheral surface shown by the two-dot chain line in the figure crosses the projection 36 each other, the outer peripheral surface of the rotor 100 and the projection 36 are pressed into contact with each other by the elastic force of the rotor 100 which tends to return to the former shape, whereby sufficient friction is produced between the outer peripheral surface of the rotor 100 and the projection 36, and the driving force can be efficiently transmitted. As such an elastic rotor 100, a metallic member can be uses as long as it has hollow sections, as shown in the figure.

In addition to the above-described vibrating plate 10, vibrating plates in various forms may be used in the third embodiment in a manner similar to the first embodiment, and a vibrating plate that is able to select between the longitudinal vibration mode and the bending vibration mode like the vibrating plate 310 shown in the second embodiment may be used.

D. Fourth Embodiment

Next, a description will be given of a piezoelectric actuator according to the fourth embodiment of the present invention. In the fourth embodiment, components common to those of the first to third embodiments are indicated by the same reference numerals, and a description thereof will be omitted.

Figure 55:
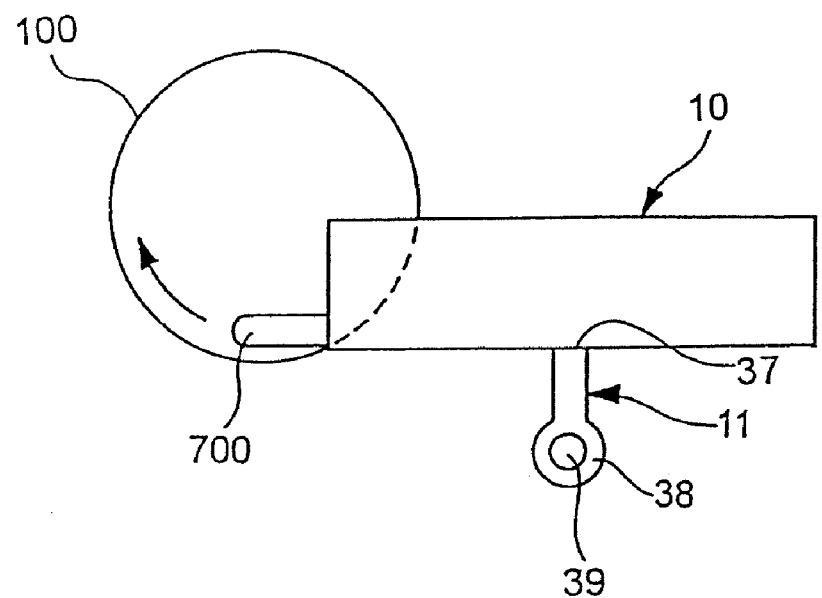
FIG. 55 is a plan view showing the overall construction of a piezoelectric actuator according to a fourth embodiment of the present invention.
Figure 56:
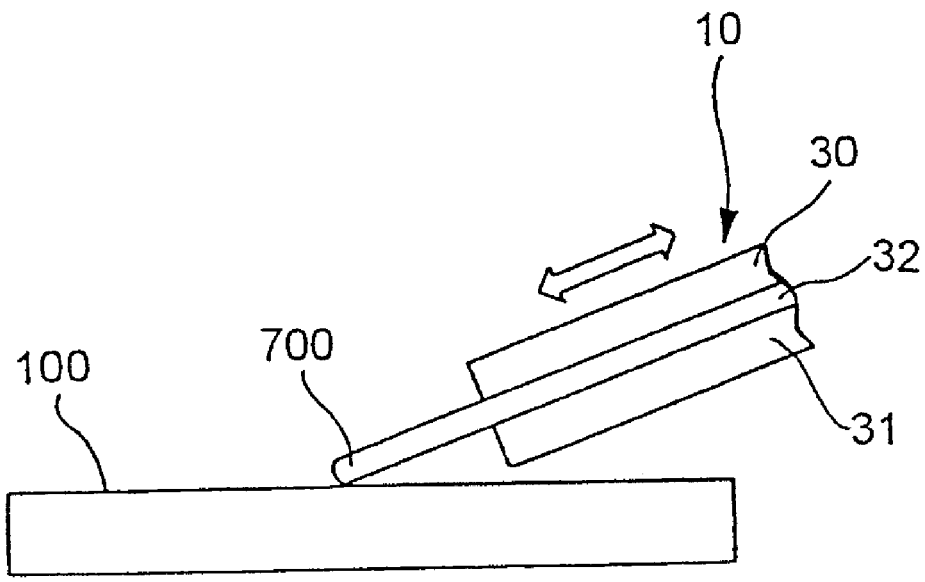
FIG. 56 is a side view showing the vicinity of a contacting part between the vibrating plate and the rotor of the piezoelectric actuator according to the fourth embodiment.

As shown in FIGS. 55 and 56, the piezoelectric actuator according to the fourth embodiment has a structure in which one end of the vibrating plate 10 is overlapped on the surface of a disk-like rotor 100. As shown in FIG. 56, the vibrating plate 10 is inclined with respect to the plane of the rotor 100, and a projection 700 projected from the vibrating plate 10 toward the plane of the rotor 100 abuts against the plane of the rotor 100 from an oblique direction.

In this construction, when a voltage is applied to a piezoelectric element of the vibrating plate 10 from a driving circuit (not shown), the vibrating plate 10 causes a longitudinal vibration in the direction shown by the arrow in the figure. When the vibrating plate 10 vibrates in such a manner as to extend toward the center of the rotor 100 during the longitudinal vibration, the one end 700 is displaced while it is in contact with the plane of the rotor 100, whereby the rotor 100 is rotationally driven in a clockwise direction shown by the arrow in FIG. 55.

Figure 57:
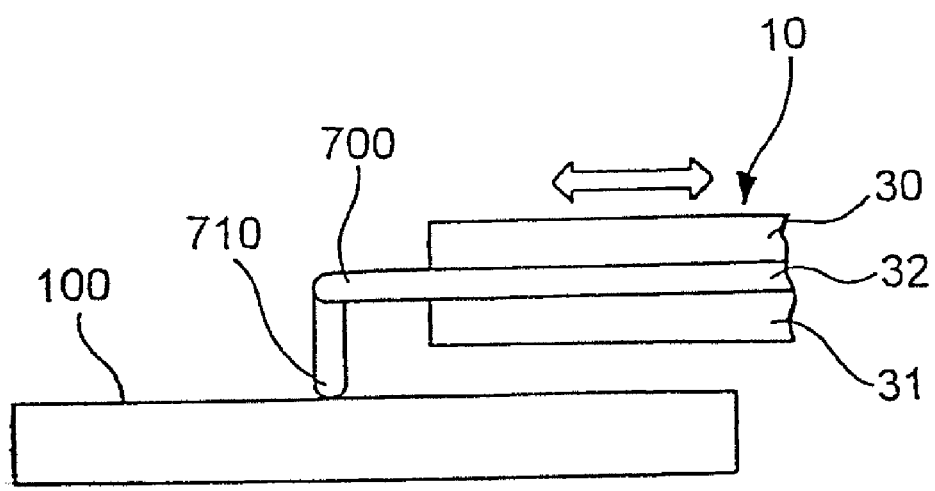
FIG. 57 is a side view showing the vicinity of the contacting part between the vibrating plate and the rotor in a modification of the piezoelectric actuator according to the fourth embodiment.

The vibrating plate 10 may be provided not only on the front surface of the rotor 100 but also on the back surface of the rotor 100. In addition, as shown in FIG. 57, a projection 710 projected downward from the projection 700 may be provided instead of inclining the vibrating plate 10 with respect to the rotor 100, and the projection 710 may be brought into abutment with the plane of the rotor 100.

In addition to the above-described vibrating plate 10, vibrating plates in various forms may be used in the fourth embodiment in a manner similar to the first embodiment.

Furthermore, a vibrating plate that is able to select the longitudinal vibration mode and the bending vibration mode may be used so as to switch the driving direction of an object to be driven. In this case, a vibrating plate 580, which vibrates in a manner similar to the above vibrating plate to drive the rotor 100 in the longitudinal vibration mode, and causes a bending vibration in an out-of-plane direction shown in FIG. 58 in the bending vibration mode may be provided, and in the bending vibration mode, the rotor 100 may be driven rightward in the figure that is a direction opposite to the direction in the longitudinal vibration mode.

When switching the longitudinal vibration mode and the bending vibration mode in this way, a driving circuit shown in FIG. 59 may be constructed. When switches 581 are switched between the longitudinal vibration mode and the bending vibration mode as shown in the figure, two stacked piezoelectric elements 30 and 31 vibrate in the same phase in the longitudinal vibration mode, whereby the vibrating plate can be allowed to cause a longitudinal vibration in an in-plane direction, and the piezoelectric elements 30 and 31 vibrate in the opposite phase in the bending vibration mode, whereby the vibrating plate can be allowed to cause a bending vibration in an out-of-plane direction. The arrows in the figure indicate a direction of polarization.

E. Modifications

Figure 60:
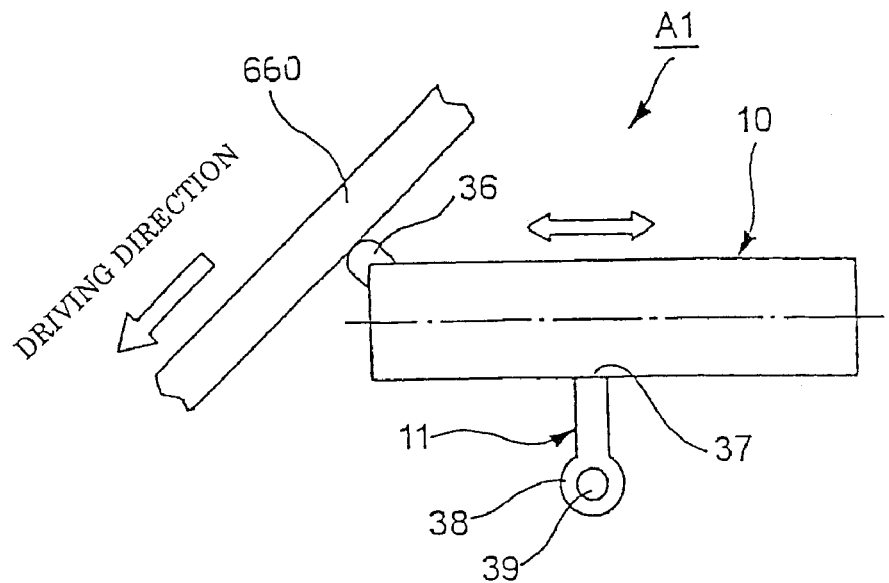
FIG. 60 is a diagram showing a modification of the piezoelectric actuator according to the first to fourth embodiments.
Figure 61:
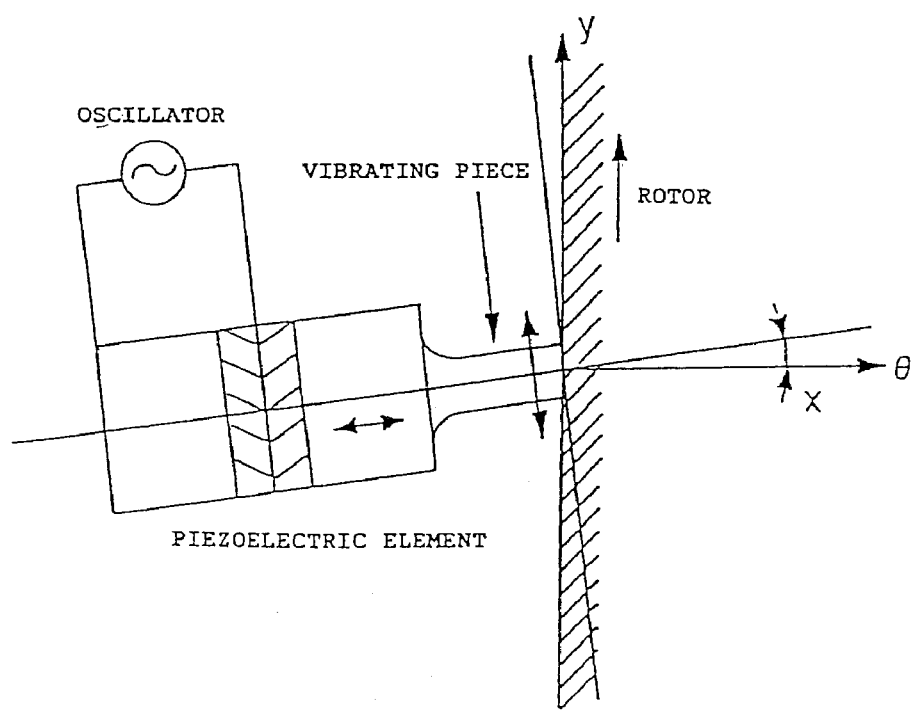
FIG. 61 is a plan view schematically showing an ultrasonic motor using a conventional piezoelectric actuator.

While the piezoelectric actuator rotationally drives the disk-like rotor in the above-described various embodiments, an object to be driven is not limited thereto. For example, the above-described vibrating plate 10 may be brought into abutment with a driving member 660 that is substantially shaped like a rectangular parallelepiped so as to drive the member 660 shaped like a rectangular parallelepiped in the longitudinal direction thereof, as shown in FIG. 60.

The piezoelectric actuator according to the above-described various embodiments can be used by being incorporated in a portable device other than a timepiece that is driven by a battery, in addition to being incorporated in the above-described calendar display mechanism of a timepiece.

While a plate-like member is used as the reinforcing plate 32 in the above-described various embodiments, a metallic film formed by sputtering and the like may be used as a reinforcing portion stacked on the piezoelectric element, and any method may be adopted to form the metallic film.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A piezoelectric actuator comprising:
    a support body;
    an oscillating plate in which a plate-shaped piezoelectric device having a lengthwise direction and a reinforcing section are layered on top of each other; and
    a support member for applying an elastic force to said oscillating plate so that an end of said oscillating plate contacts a target to be driven, the support member being an elastic member that has a secured section that is secured to said support body and an attachment section that is attached to said oscillating plate;
    wherein application of electric power to said piezoelectric device excites a longitudinal oscillation in said piezoelectric device in the lengthwise direction of said oscillating plate;
    wherein a stretching and contracting component of said longitudinal oscillation at least partially drives a bending oscillation of said piezoelectric device in a widthwise direction of said oscillating plate;
    wherein a displacement of the oscillating plate caused by said longitudinal oscillation and said bending oscillation drives said target to be driven;
    wherein said oscillating plate is configured such that resonant frequencies of said longitudinal oscillation and said bending oscillation are substantially the same; and
    wherein said end that contacts said target to be driven of said oscillating plate has a protrusion, the protrusion contacting said target to be driven.

2. The piezoelectric actuator of claim 1, wherein said protrusion is formed off a center line along the geometric center of said oscillating plate in the lengthwise direction.

3. The piezoelectric actuator of claim 1, wherein said protrusion is formed as an integral part of said reinforcing section.

4. The piezoelectric actuator of claim 1 wherein said oscillating plate is configured so that said bending oscillation is produced by a counterforce applied from said target to be driven when said longitudinal oscillation occurs.

5. A piezoelectric actuator comprising:
    a support body;
    an oscillating plate in which a plate-shaped piezoelectric device having a lengthwise direction and a reinforcing section are layered on top of each other; and
    a support member for applying an elastic force to said oscillating plate so that an end of said oscillating plate contacts a target to be driven, the support member being an elastic member that has a secured section that is secured to said support body and an attachment section that is attached to said oscillating plate;
    wherein application of electric power to said piezoelectric device excites a longitudinal oscillation in said piezoelectric device in the lengthwise direction of said oscillating plate;
    wherein a stretching and contracting component of said longitudinal oscillation at least partially drives a bending oscillation of said piezoelectric device in a widthwise direction of said oscillating plate;
    wherein a displacement of the oscillating plate caused by said longitudinal oscillation and said bending oscillation drives said target to be driven;
    wherein said oscillating plate is configured such that resonant frequencies of said longitudinal oscillation and said bending oscillation are substantially the same; and
    wherein said reinforcing section is made of a conductor and electric power is applied to said piezoelectric device via said reinforcing section.

6. The piezoelectric actuator of claim 1, wherein an outline of said piezoelectric device has a first planar shape, and an outline of said reinforcing section has a second planar shape substantially the same as said first planar shape.

7. A piezoelectric actuator comprising:
    a support body;
    an oscillating plate in which a plate-shaped piezoelectric device having a lengthwise direction and a reinforcing section are layered on top of each other; and
    a support member for applying an elastic force to said oscillating plate so that an end of said oscillating plate contacts a target to be driven, the support member being an elastic member that has a secured section that is secured to said support body and an attachment section that is attached to said oscillating plate;
    wherein application of electric power to said piezoelectric device excites a longitudinal oscillation in said piezoelectric device in the lengthwise direction of said oscillating plate;
    wherein a stretching and contracting component of said longitudinal oscillation at least partially drives a bending oscillation of said piezoelectric device in a widthwise direction of said oscillating plate;

wherein a displacement of the oscillating plate caused by said longitudinal oscillation and said bending oscillation drives said target to be driven;

wherein said oscillating plate is configured such that resonant frequencies of said longitudinal oscillation and said bending oscillation are substantially the same; and wherein said attachment section of said support member is attached to said oscillating plate perpendicular to said longitudinal direction along an oscillation node of said oscillating plate.

8. The piezoelectric actuator of claim 1, wherein said target to be driven is a revolving body that is revolvably supported with respect to said support body, and an end of said oscillating plate in the lengthwise direction contacts an outer surface of said revolving body.

9. A piezoelectric actuator comprising:
a support body;
an oscillating plate in which a plate-shaped piezoelectric device having a lengthwise direction and a reinforcing section are layered on top of each other; and
a support member for applying an elastic force to said oscillating plate so that an end of said oscillating plate contacts a target to be driven, the support member being an elastic member that has a secured section that is secured to said support body and an attachment section that is attached to said oscillating plate;
wherein application of electric power to said piezoelectric device excites a longitudinal oscillation in said piezoelectric device in the lengthwise direction of said oscillating plate;
wherein a stretching and contracting component of said longitudinal oscillation at least partially drives a bending oscillation of said piezoelectric device in a widthwise direction of said oscillating plate;
wherein a displacement of the oscillating plate caused by said longitudinal oscillation and said bending oscillation drives said target to be driven;
wherein said oscillating plate is configured such that resonant frequencies of said longitudinal oscillation and said bending oscillation are substantially the same; and
wherein said reinforcing section is thinner than said piezoelectric device.

10. A portable apparatus comprising:
a piezoelectric actuator as described in claim 1, and
a battery for supplying electric power to said piezoelectric actuator.

11. A piezoelectric actuator comprising:
a support body;
an oscillating plate in which a plate-shaped piezoelectric device having a lengthwise direction and a reinforcing section are layered on top of each other;
a support member that supports said oscillating plate on said support body, and that has a secured section that is secured to said support body and an attachment section that is attached to said oscillating plate; and
an elastic member for applying an elastic force to said oscillating plate so that an end of said oscillating plate contacts a target to be driven;
wherein application of electric power to said piezoelectric device excites a longitudinal oscillation in said piezoelectric device in the lengthwise direction of said oscillating plate;

wherein a stretching and contracting component of said longitudinal oscillation at least partially drives a bending oscillation of said piezoelectric device in a widthwise direction of said oscillating plate;

wherein a displacement of the oscillating plate caused by said longitudinal oscillation and said bending oscillation drives said target to be driven;

wherein said oscillating plate is configured such that resonant frequencies of said longitudinal oscillation and said bending oscillation are substantially the same; and wherein said end that contacts said target to be driven of said oscillating plate has a protrusion, the protrusion contacting said target to be driven.

12. The piezoelectric actuator of claim 11, wherein said protrusion is formed off a center line along the geometric center of said oscillating plate in the lengthwise direction.

13. The piezoelectric actuator of claim 11, wherein said protrusion is formed as an integral part of said reinforcing section.

14. The piezoelectric actuator of claim 11, wherein said oscillating plate is configured so that said bending oscillation is produced by a counterforce applied from said target to be driven when said longitudinal oscillation occurs.

15. A piezoelectric actuator comprising:
a support body;
an oscillating plate in which a plate-shaped piezoelectric device having a lengthwise direction and a reinforcing section are layered on top of each other;
a support member that supports said oscillating plate on said support body, and that has a secured section that is secured to said support body and an attachment section that is attached to said oscillating plate; and
an elastic member for applying an elastic force to said oscillating plate so that an end of said oscillating plate contacts a target to be driven;
wherein application of electric power to said piezoelectric device excites a longitudinal oscillation in said piezoelectric device in the lengthwise direction of said oscillating plate;
wherein a stretching and contracting component of said longitudinal oscillation at least partially drives a bending oscillation of said piezoelectric device in a widthwise direction of said oscillating plate;
wherein a displacement of the oscillating plate caused by said longitudinal oscillation and said bending oscillation drives said target to be driven;
wherein said oscillating plate is configured such that resonant frequencies of said longitudinal oscillation and said bending oscillation are substantially the same; and
wherein said reinforcing section is made of a conductor and electric power is applied to said piezoelectric device via said reinforcing section.

16. The piezoelectric actuator of claim 11, wherein an outline of said piezoelectric device has a first planar shape, and an outline of said reinforcing section has a second planar shape substantially the same as said first planar shape.

17. A piezoelectric actuator comprising:
a support body;
an oscillating plate in which a plate-shaped piezoelectric device having a lengthwise direction and a reinforcing section are layered on top of each other;
a support member that supports said oscillating plate on said support body, and that has a secured section that is secured to said support body and an attachment section that is attached to said oscillating plate; and an elastic member for applying an elastic force to said oscillating plate so that an end of said oscillating plate contacts a target to be driven;

wherein application of electric power to said piezoelectric device excites a longitudinal oscillation in said piezoelectric device in the lengthwise direction of said oscillating plate;

wherein a stretching and contracting component of said longitudinal oscillation at least partially drives a bending oscillation of said piezoelectric device in a widthwise direction of said oscillating plate;

wherein a displacement of the oscillating plate caused by said longitudinal oscillation and said bending oscillation drives said target to be driven;

wherein said oscillating plate is configured such that resonant frequencies of said longitudinal oscillation and said bending oscillation are substantially the same; and wherein said attachment section of said support member is attached to said oscillating plate perpendicular to said longitudinal direction along said an oscillation node of said oscillating plate.

18. The piezoelectric actuator of claim 11, wherein said target to be driven is a revolving body that is revolvably supported with respect to said support body, and an end of said oscillating plate in the lengthwise direction contacts an outer surface of said revolving body.

19. A piezoelectric actuator comprising:

a support body;

an oscillating plate in which a plate-shaped piezoelectric device having a lengthwise direction and a reinforcing section are layered on top of each other;

a support member that supports said oscillating plate on said support body, and that has a secured section that is secured to said support body and an attachment section that is attached to said oscillating plate; and an elastic member for applying an elastic force to said oscillating plate so that an end of said oscillating plate contacts a target to be driven;

wherein application of electric power to said piezoelectric device excites a longitudinal oscillation in said piezoelectric device in the lengthwise direction of said oscillating plate;

wherein a stretching and contracting component of said longitudinal oscillation at least partially drives a bending oscillation of said piezoelectric device in a widthwise direction of said oscillating plate;

wherein a displacement of the oscillating plate caused by said longitudinal oscillation and said bending oscillation drives said target to be driven;

wherein said oscillating plate is configured such that resonant frequencies of said longitudinal oscillation and said bending oscillation are substantially the same; and wherein said reinforcing section is thinner than said piezoelectric device.

20. A portable apparatus comprising:

a piezoelectric actuator as described in claim 11; and a battery for supplying electric power to said piezoelectric actuator.

* * * * *